US005773838A

United States Patent [19]
Nakasuji

[11] Patent Number: 5,773,838
[45] Date of Patent: Jun. 30, 1998

[54] APPARATUS FOR IMAGE TRANSFER WITH CHARGED PARTICLE BEAM, AND DEFLECTOR AND MASK USED WITH SUCH APPARATUS

[75] Inventor: Mamoru Nakasuji, Kanagawa-ken, Japan

[73] Assignee: Nikon Corporation, Tokyo, Japan

[21] Appl. No.: 871,971

[22] Filed: Jun. 10, 1997

Related U.S. Application Data

[62] Division of Ser. No. 548,616, Oct. 26, 1995, Pat. No. 5,689,117.

[30] Foreign Application Priority Data

Nov. 22, 1994 [JP] Japan .................................. 6-288057
Dec. 15, 1994 [JP] Japan .................................. 6-311975
Dec. 28, 1994 [JP] Japan .................................. 6-329094
Dec. 28, 1994 [JP] Japan .................................. 6-329095

[51] Int. Cl.[6] ............................................... H01J 37/30
[52] U.S. Cl. ................................... 250/492.23; 250/398
[58] Field of Search ........................ 250/492.23, 492.2, 250/396 ML, 398

[56] References Cited

U.S. PATENT DOCUMENTS

| 4,198,569 | 4/1980 | Takayama ...................... 250/396 ML |
| 5,079,112 | 1/1992 | Berger et al. ............................... 430/4 |
| 5,130,213 | 7/1992 | Berger et al. ............................... 430/4 |
| 5,258,246 | 11/1993 | Berger et al. ............................... 430/4 |
| 5,260,151 | 11/1993 | Berger et al. ............................... 430/5 |
| 5,279,925 | 1/1994 | Berger et al. ........................... 430/246 |
| 5,334,282 | 8/1994 | Nakayama et al. ..................... 156/643 |
| 5,382,800 | 1/1995 | Nishino et al. ................. 250/396 ML |
| 5,523,580 | 6/1996 | Davis .................................. 250/505.1 |

*Primary Examiner*—Jack I. Berman
*Attorney, Agent, or Firm*—Armstrong, Westerman, Hattori, McLeland & Naughton

[57] ABSTRACT

An image transferring apparatus using a charged particle beam comprising a projection lens for transferring a pattern formed on a mask onto a target by focusing a charged particle beam passed through the mask, and a deflector for deflecting the charged particle beam passed through the mask toward a predetermined direction (x-axis direction) so that a transfer position of the pattern to the target is changed. In this apparatus, the deflector comprises a deflection coil for generating a deflection magnetic field extending in a direction (y-axis direction) perpendicular to the predetermined direction, and correction coils for generating correction magnetic fields extending in the same direction as the deflection magnetic field at areas spaced apart from the center of the deflection magnetic field along the direction (x-axis direction) perpendicular to the direction of the deflection magnetic field.

2 Claims, 19 Drawing Sheets

APPARATUS FOR IMAGE TRANSFER WITH CHARGED PARTICLE BEAM, AND DEFLECTOR AND MASK USED WITH SUCH APPARATUS

This is a divisional of application Ser. No. 08/548,616 filed Oct. 26. 1995, now U.S. Pat. No. 5,689,117.

BACKGROUND OF THE INVENTION

1. Field of the Invention

The present invention relates to a deflector for deflecting a charged particle beam toward a desired position, and more particularly, it relates to a deflector suitable to be used with a transferring apparatus for transferring a mask pattern onto a photosensitive substrate by using a charged particle beam. The present invention also relates to a charged particle beam transferring apparatus for transferring a pattern image formed on a mask onto a target object by using a charged particle beam.

2. Related Background Art

As one of lithographic apparatuses for printing an integrated circuit on a semi-conductor wafer, there has been proposed a charged particle beam reduction-transferring apparatus wherein a charged particle beam is directed onto a mask having a predetermined pattern and a pattern included in an illumination range is reduction-transferred onto a wafer through a projection lens. In such an apparatus, a mask on which a number of small regions each having the pattern are bordered in a grid pattern by bordering regions having no pattern is used (for example, refer to U.S. Pat. No. 5,260,151). Thus, the electron beam passed through the small region on the mask must be deflected by an amount corresponding to a width of the bordering region by means of a deflector so that the pattern images of the small regions are positioned contiguous to each other when they are transferred onto the wafer. Such a deflector includes deflection coils such as coils $1a$, $1b$ of saddle type shown in FIG. 6A or toroidal coils $2a$, $2b$ shown in FIG. 6B. The saddle coils $1a$, $1b$ are wound to define a pair of curved surfaces positioned symmetrically with respect to a center line CL of the deflector so that a magnetic field H extending perpendicular to the center line CL is generated by applying currents flowing in the directions shown by the arrows. The toroidal coils $2a$, $2b$ are wound on a cylindrical core ring $2c$ symmetrically with respect to a center line CL of the core ring so that a magneticfield H extending perpendicular to the center line CL of the core ring $2c$ is generated by applying currents flowing in the directions shown by the arrows.

In the above-mentioned conventional transferring apparatus, if deflection sensitivity of the deflector is not uniform in a cross-section of the electron beam, deflection distortion will occur in the transferred pattern. In the conventional deflectors, the deflection sensitivity is greatly changed in accordance with positions in the magnetic field, and, since a range in which the uniform deflection sensitivity can be obtained is limited to a very small area near the center of the deflector, it is necessary to utilize a deflector having a dimension considerably greater than the field dimension of the mask. For example, when it is assumed that a permissible value for the deflection distortion of the electron beam passed through the small region (on the mask) having a dimension of 1 mm×1 mm after the beam is deflected by 1 mm on the wafer is 10 nm (nanometer), permissible accuracy cannot be obtained unless the electron beam passes through a narrow area within D/8–D/10 from the center line CL of the deflector where D is an inner diameter of the core of the deflector (inner diameter of a ferromagnetic cylinder contacted with an outer side of a deflection coil; refer to FIG. 2). The following calculation results show examples of a relation between a ratio (core inner diameter of deflection coil/maximum field dimension of mask) and the deflection distortion. Incidentally, in each of these examples, the calculated value represents an amount of the deflection distortion when the small region (on the mask) having the dimension of 1 mm×1 mm is deflected by 1 mm on the wafer with pattern reduction of ¼ (from the mask to the wafer).

(1) When the ratio is: core inner diameter/maximum field dimension=1.14:

$$0.518 \times (1/5.7) \times (1/4) = 22.7 \ \mu m$$

(2) When the ratio is: core inner diameter/maximum field dimension=1.6:

$$0.137 \times (1/8) \times (1/4) = 4.28 \ \mu m$$

(3) When the ratio is: core inner diameter/maximum field dimension=2.0:

$$0.0574 \times (1/10) \times (1/4) = 1.43 \ \mu m$$

(4) When the ratio is: core inner diameter/maximum field dimension=2.6:

$$0.019 \times (1/13.3) \times (1/4) = 356 \ nm$$

(5) When the ratio is: core inner diameter/maximum field dimension=4:

$$4.02 \times 10^{-3} \times (1/20) \times (1/4) = 50.25 \ nm$$

(6) When the ratio is: core inner diameter/maximum field dimension=8:

$$2.56 \times 10^{-4} \times (1/40) \times (1/4) = 1.6 \ nm$$

As apparent from the above calculation results, there arises a problem that the deflection distortion cannot be sufficiently reduced unless the inner diameter of the core of the deflector is set to become greater than the maximum field dimension of the mask by 5–8 times.

On the other hand, in the conventional charged particle beam transferring apparatuses, it has been said that, when a distance between the mask and the target is L, the reduction ratio of the pattern from the mask to the target is 1/n and a point spaced apart from the mask toward the target by an amount of L·n/(n+1) is set as "cross-over" of the charged particle beam (for example, electron beam), low aberration can be obtained when a position bisecting a distance between the mask and the cross-over coincides with a central position of the projection lens at the mask side and a position bisecting a distance between the cross-over and the target coincides with a central position of the projection lens at the target side. On the other hand, Japanese Patent Laid-open No. 5-160012 (1993) discloses a technique in which the mask side projection lens is displaced from the lens position toward the mask by an amount of ε (ε is a positive constant) and the target side projection lens is displaced from the lens position toward the target by an amount of n·ε.

In the charged particle beam reduction-transferring apparatuses, if the electron beam emitted from an electronic gun has energy divergence, radial and azimuthal aberrations (transverse chromatic aberration) will take place. The transverse chromatic aberration includes a real number portion which is called as radial aberration and an imaginary number portion which is called as azimuthal aberration. These transverse chromatic aberrations are substantially proportional to the cube of magnitude of a visual field of an optical system. The transverse chromatic aberration cannot be corrected by so-called filed division wherein the main visual field of the optical system is divided into a plurality of sub-fields and the pattern is division-transferred by transferring the respective sub-field successively. Accordingly, the transverse chromatic aberration causes problem particularly when the main visual field of the optical system is great. In this specification, the field before the field division is called as "main visual field" and each of the divided small areas is called as "sub-field".

In the above-mentioned conventional apparatuses, when it is assumed that the point internally dividing the distance between the mask and the target with reduction ratio is set as the cross-over, theoretically, a main light beam of the electron beam incident on the mask perpendicular thereto passes through the cross-over. However, since the projection lens has spherical aberration, if a lens condition is determined to satisfy the positive focus condition in each sub-field, the main light beam of the electron beam incident on the mask perpendicular thereto will not necessarily pass through the cross-over, thereby generating distortion. To avoid such distortion, the lens condition must be selected so that the main light beam of the electron beam passes through the cross-over (In this case, the main light beam incident on the mask is not perpendicular to the mask). Similarly, regarding the position between the cross-over and the target, the lens condition for satisfying the perpendicularity of the electron beam to the target does not coincide with the lens condition for passing the electron beam through the cross-over. Accordingly, in order to reduce the distortion of the pattern, the perpendicularity of the electron beam to the target should be given up. However, when the incident direction of the electron beam is inclined with respect to a plane perpendicular to a transfer surface of the target to which the pattern is to be transferred, if the transfer surface is deviated along an optical axis of the optical system due to a warp of the target, the transfer position of the pattern will also be deviated, thereby arising a problem that pattern error is caused.

When the mask including a number of small regions having the patterns and bordered in the grid pattern by the bordering regions is used, the electron beams passed through the mask are deflected so that the pattern regions are contiguous to each other without interposition of any bordering regions in the transferred area on the target (such as a wafer). Since the deflection amount is increased as the number of the small regions is increased, when the semiconductor having a great surface area is manufactured, a large deflector must be used, thereby making the optical system bulky and thus increasing the distortion of the transferred pattern.

SUMMARY OF THE INVENTION

An object of the present invention is to provide a deflector and a charged particle beam transferring apparatus using such a deflector, in which a greater range in the deflector can be used for performing deflection.

To achieve the above object, according to the present invention, there is provided a charged particle beam transferring apparatus comprising a deflection coil means for generating a deflection magnetic field to deflect a charged particle beam, and a correction coil means for generating a correction magnetic field to correct deflection sensitivity of the deflection coil.

The present invention further provides a charged particle beam transferring apparatus comprising a projection lens means for transferring a pattern formed on a mask onto a target by gathering charged particle beams passed through the mask, and a deflector means for deflecting the charged particle beams passed through the mask toward a predetermined direction (x-axis direction) to change transfer positions of segments of the pattern and wherein the deflector means includes a deflection coil means for generating a deflection magnetic field extending in a direction (y-axis direction) perpendicular to the predetermined direction, and a correction coil means for generating correction magnetic fields extending in the same direction as the deflection magnetic field at areas spaced apart from the center of the deflection magnetic field along a direction (x-axis direction) perpendicular to the direction of the deflection magnetic field.

Another object of the present invention is to provide a charged particle beam reduction-transferring apparatus which can reduce transverse chromatic aberration regarding radial and azimuthal aberrations.

To achieve this object, according to the present invention, there is provided a charged particle beam reduction-transferring apparatus for reduction-transferring a pattern image of a mask onto a target by directing an electron beam passed through the mask to first and second projection lenses successively, wherein, when a distance between the mask and the target is L, reduction ratio of the pattern from the mask to the target is 1/n, a positive constant number is $\epsilon$ and a point spaced apart from the mask toward the target by an amount of $L \cdot n/(n+1)$ is set as cross-over of the charged particle beam optical system, the central position of the first projection lens along an optical axis thereof is displaced toward the cross-over by an amount of $n \cdot \epsilon$ with respect to the position bisecting the distance between the mask and the cross-over, and the central position of the second projection lens along an optical axis thereof is displaced toward the cross-over by an amount of $\epsilon$ with respect to the position bisecting the distance between the cross-over and the target.

The present invention further provides a charged particle beam reduction-transferring apparatus for reduction-transferring a pattern image of a mask onto a target by directing an electron beam passed through the mask to first and second projection lenses successively, wherein the bore radii $R_{1c}$, $R_{2c}$ of the first and second projection lenses on the cross-over side are set to be smaller than ¼ of the bore radii $R_{1o}$, $R_{2o}$ on the other side.

A further object of the present invention is to provide a charged particle beam transferring apparatus wherein both a condition regarding perpendicularity of an electron beam incident on a mask and a target and a condition for passing a main light path of the electron beam through the cross-over are satisfied simultaneously.

To achieve this object, according to the present invention, there is provided a charged particle beam transferring apparatus for transferring a pattern image of a mask onto a target by using a charged particle beam, comprising an angle adjusting deflector means for adjusting an incident angle of the charged particle beam incident on the mask or the target.

A still further object of the present invention is to provide a charged particle beam transferring mask and a charged particle beam transferring method, wherein a deflection amount of a charged particle beam passed through the mask can be reduced or the deflection of the charged particle beam can be eliminated.

To achieve this object, according to the present invention, there is provided a charged particle beam transferring mask wherein a pattern to be transferred to a target is divided into a plurality of pattern segments which are formed on a plurality of corresponding small regions disposed side by side in vertical and horizontal directions and the small regions are bordered by bordering regions each having no pattern, and further wherein the pattern segments to be transferred to the target in a line are divided and formed on first and second rows of small regions.

The present invention further provides a charged particle beam transferring method wherein a mask (in which a pattern to be transferred to a target is divided into a plurality of pattern segments which are formed on a plurality of corresponding small regions disposed side by side in vertical and horizontal directions and the small regions are bordered by bordering regions each having no pattern) is used and a charged particle beam is successively directed on the small regions disposed side by side along a second direction (Y-axis direction) perpendicular to a first direction (x-axis direction) while shifting the mask and the target in the first direction along which the small regions are disposed side by side, thereby performing the transferring of the pattern, and further wherein, after the transferring of one row or a plurality of rows of small regions disposed side by side along the second direction is finished and before the transferring of an adjacent row of small regions in the first direction is started, a shifting speed of the mask in the first direction is made greater than a shifting speed of the target in the first direction so that a relative distance between the mask and the target is changed by an amount equal to or a plurality of times a width of the bordering region in the first direction.

DETAILED DESCRIPTION

Figure 1:
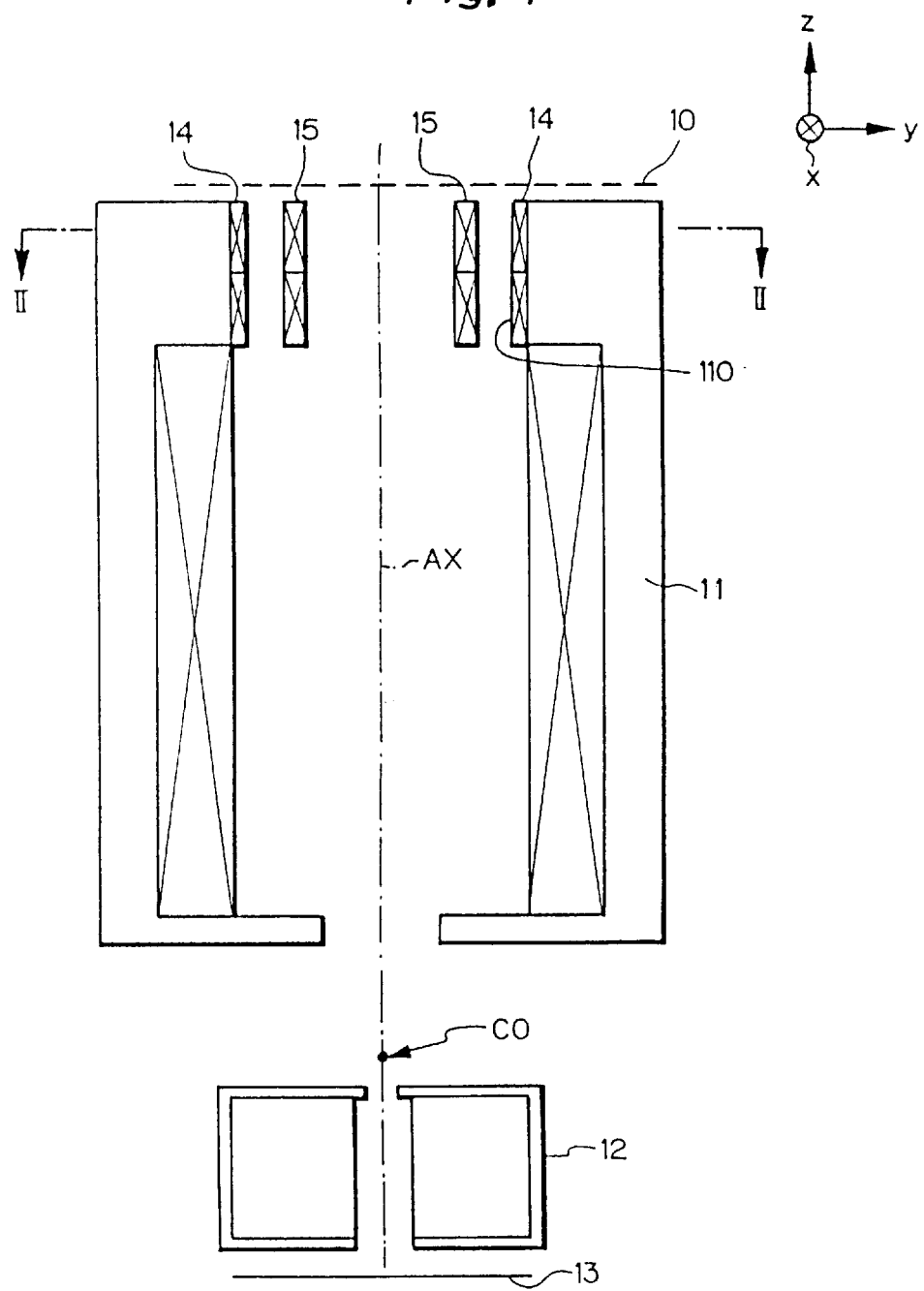
FIG. 1 is a schematic illustration showing an optical system between a mask and a wafer in a charged particle beam transferring apparatus according to a first embodiment of the present invention.

First of all, a first embodiment of the present invention will be explained with reference to FIGS. 1 to 5. FIG. 1 schematically shows an optical system between a mask and a wafer in a charged particle beam transferring apparatus according to the first embodiment. In FIG. 1, the apparatus includes a mask 10, a first projection lens 11, a second projection lens 12, and a wafer 13 comprised of a photosensitive substrate acting as a target. Within a magnetic pole (core) 110 of the first projection lens 11 at the mask side, there are disposed a deflection coil means 14 and a correction coil means 15, which will be fully described later. Above the mask 10, there are disposed an electronic gun for emitting an electron beam, a condenser and an aperture for forming the electron beam as a beam having a rectangular cross-section (square in the illustrated embodiment), and a visual field selecting deflector for directing the formed electron beam to a predetermined position on the mask 10; however, these elements are omitted from illustration. The mask 10 and the wafer 13 can be shifted, by means of respective stages (not shown) in an x-axis direction (perpendicular to the plane of FIG. 1) and a y-axis direction which are orthogonal to each other in a plane perpendicular to an optical axis AX of the optical system. Hereinafter, a direction along the optical axis AX is referred to as a z-axis direction.

Figure 5:
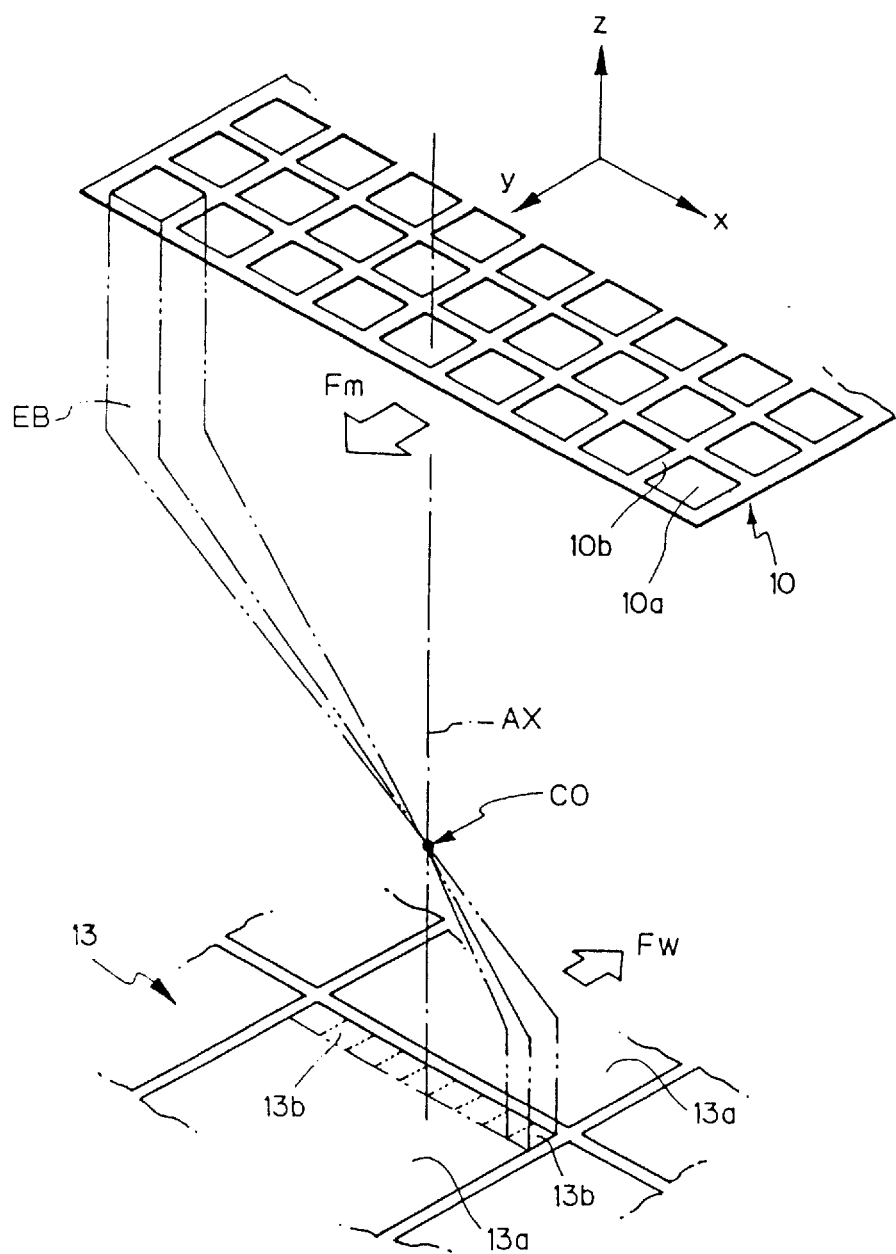
FIG. 5 is a perspective view showing a transferring operation of the charged particle beam transferring apparatus according to the first embodiment.
Figure 6A:
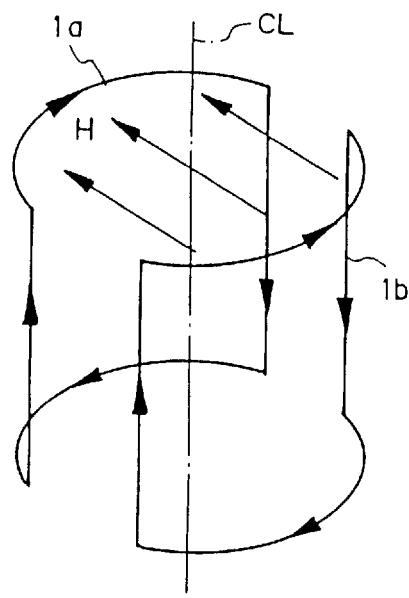
FIG. 6A is a perspective view of an exemplary coils of saddle type of the deflector.
Figure 6B:
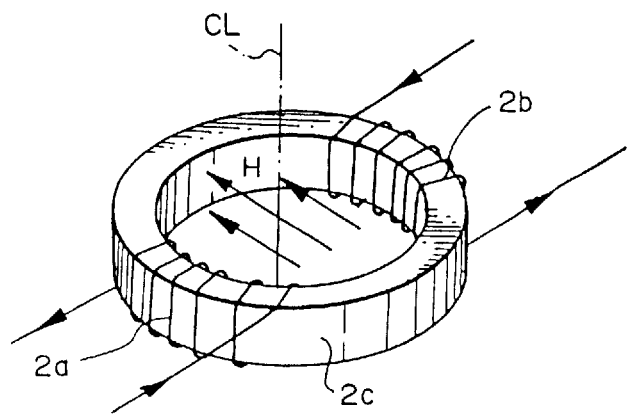
FIG. 6B is a perspective view of an exemplary toroidal coils of the deflector.

FIG. 5 shows a condition that the transferring is performed by using the above-mentioned transferring apparatus. In FIG. 5, the directions of the X-axis, y-axis and z-axis are the same as those shown in FIG. 1. The lenses and the deflection coil means are omitted from illustration in FIG. 5.

As apparent from FIG. 5, the mask 10 has a plurality of rectangular small regions 10a, and bordering regions 10b dividing or bordering the small regions in a grid pattern. The pattern to be transferred to an area 13a (corresponding to one chip, i.e. one semiconductor) on the wafer 13 is divided into pattern segments, and these pattern segments are formed on the corresponding small regions 10a. The electron beam EB emitted from the electronic gun (not shown) is formed to have a square cross-section slightly greater than the small region 10a, and is deflected by means of the visual field selecting deflectors (not shown) from the optical axis AX of the optical system toward the x-axis direction so that it is directed to one of the small regions 10a on the mask 10. The bordering regions have no pattern, and the electron beam directed to the bordering region does not reach the wafer 13. Incidentally, the details of the pattern segment formed on each small region 10a is not illustrated. A cross-over point of the electron beam EB provided by the projection lens 11 is designated by "CO".

In the above-mentioned apparatus, during the transferring operation, for example, as shown by the arrows Fm, Fw, the mask 10 and the wafer 13 are continuously shifted in opposite directions along the y-axis direction. Synchronously with these continuous movements, the electron beam EB directed to the mask 10 is scanned step by step in the x-axis direction by a pitch of the small region 10a so that the small regions 10a disposed side by side along the x-axis direction are successively illuminated by the electron beam EB. As a result, the pattern segments formed on the small regions 10a are transferred, by means of the projection lenses 11, 12, onto predetermined areas 13b on the wafer 13 with predetermined reduction ratio (for example, ¼). One of the predetermined area 13b on the wafer 13 corresponds to one of the small regions 10a on the mask 10.

Upon transferring the pattern image, the electron beam EB passed through the mask 10 is deflected by magnetic fields generated by the deflection coil means 14 and the correction coil means 15 in the x-axis direction by an amount corresponding to the width of the bordering region 10b. That is to say, since a non-exposed area corresponding to the bordering region 10b of the mask 10 is formed between the adjacent exposed areas 13b on the wafer if the electron beams EB passed through the corresponding small regions 10a are merely focused on the wafer 13 by the first and second projection lenses 11, 12, the transfer position for each pattern segment is displaced in the x-axis direction by the amount corresponding to the width of the bordering region 10b so that the transferred images of the pattern segments are contiguous to each other. After the transferring of the pattern segments on a row of small regions 10a disposed side by side along the x-axis direction is finished, the transferring of the pattern segments on a next row of small regions adjacent to the previous row in the y-axis direction is performed. By repeating similar operations, the pattern segments formed on all of the small regions 10a of the mask 10 are transferred onto the wafer 13.

As mentioned above, in the transferring apparatus according to the first embodiment, since the electron beam passed through the mask 10 is deflected merely in the x-axis direction, the visual field or field of view of the optical system has an elongated rectangular shape including a row of small regions 10a disposed side by side along the x-axis direction and corresponding bordering regions 10b. That is to say, as shown by the reference numeral 20 in FIG. 2, an area through which the electron beam passes in the magnetic pole 110 of the projection lens 11 has a rectangular shape elongated in the x-axis direction, and the electron beam does not pass through any area surrounding the elongated rectangular area (visual field) 20. Accordingly, a zone between an area 21 including the visual field 20 with some play or margin and the inner boundary of the magnetic pole 110 can be used as a space for installing the deflection coil. Further, it is important that the deflection sensitivity is uniform within the visual field 20 in FIG. 2, and the deflection sensitivity regarding the area surrounding the visual field does not affect the deflection distortion of the images transferred to the wafer 13. Thus, in the illustrated embodiment, the deflection coil means 14 and the correction coil means 15 are installed as follows.

Figure 2:
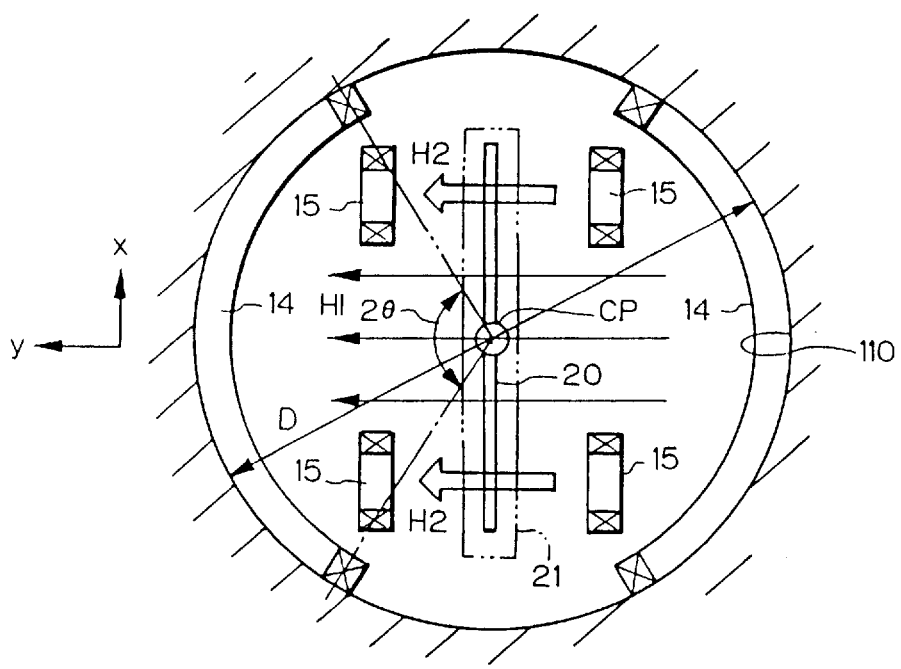
FIG. 2 is a sectional view taken along the line II—II in FIG. 1.
Figure 3:
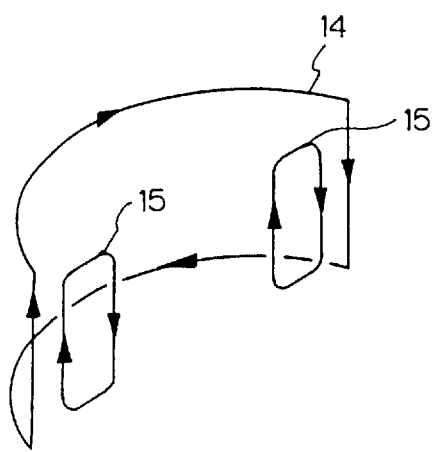
FIG. 3 is a perspective view schematically showing a deflection coil and a correction coil according to the first embodiment.

As shown in FIGS. 2 and 3, the deflection coil means 14 comprises a pair of coils of saddle type wound in close contact with the inner surface of the magnetic pole 110. Accordingly, the magnetic pole 110 is used as a core for the deflection coils 14. The direction of the magnetic field generated by the deflection coils 14 is shown by the arrows H1 and is orthogonal to the visual field 20. A wide angle $2\theta$ of the deflection coil 14 with respect to a central position CP of the magnetic pole 110 (coincides with the optical axis AX) is 120 degrees, because, when the wide angle is 120 degrees, the third term of the deflection magnetic field becomes zero. The intensity of the magnetic field generated by such deflection coils 14 is decreased at peripheral portions spaced apart from the center CP of the magnetic field in the direction (x-axis direction) perpendicular to the direction of the magnetic field. Thus, in the illustrated embodiment, the correction coil means 15 are disposed in the vicinity of both longitudinal ends of the visual field 20 to generate correction magnetic fields H2 each having the same direction as the deflection magnetic field. Each correction coil is wound in a saddle fashion, as shown in FIG. 3.

By providing the deflection coil means 15 and the correction coil means 15 in this way, in the vicinity of the both ends of the visual field 20, the magnetic fields H2 of the correction coil means 15 are overlapped with the deflection magnetic field to compensate for the reduction of the intensity of the magnetic field of the deflection coil means 14. Accordingly, by adjusting values of currents applied to the correction coil means 15, it is possible to improve the deflection sensitivity at each end of the visual field 20 to become substantially the same as the deflection sensitivity at the central portion of the visual field, thereby suppressing the deflection distortion. In this case, since the magnetic flux flown out of the correction coil means 15 is returned to the correction coil means again through the magnetic core 110, the magnetic field at the central portion of the deflector is not subjected to a bad influence.

Figure 4A:
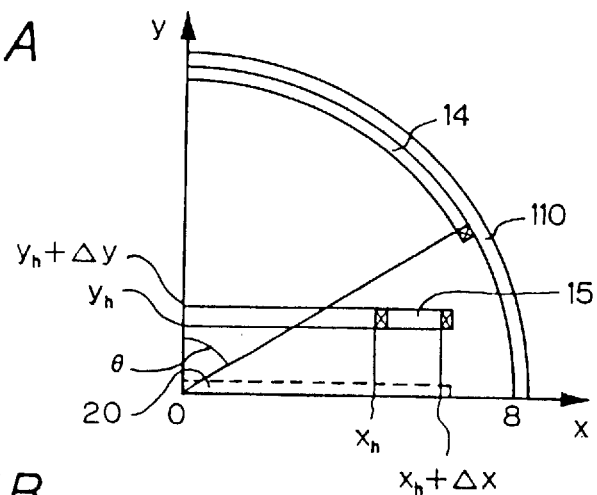
FIGS. 4A and 4B are views showing a relation between a position of the correction coil and magnetic field intensity of a deflector.
Figure 4B:
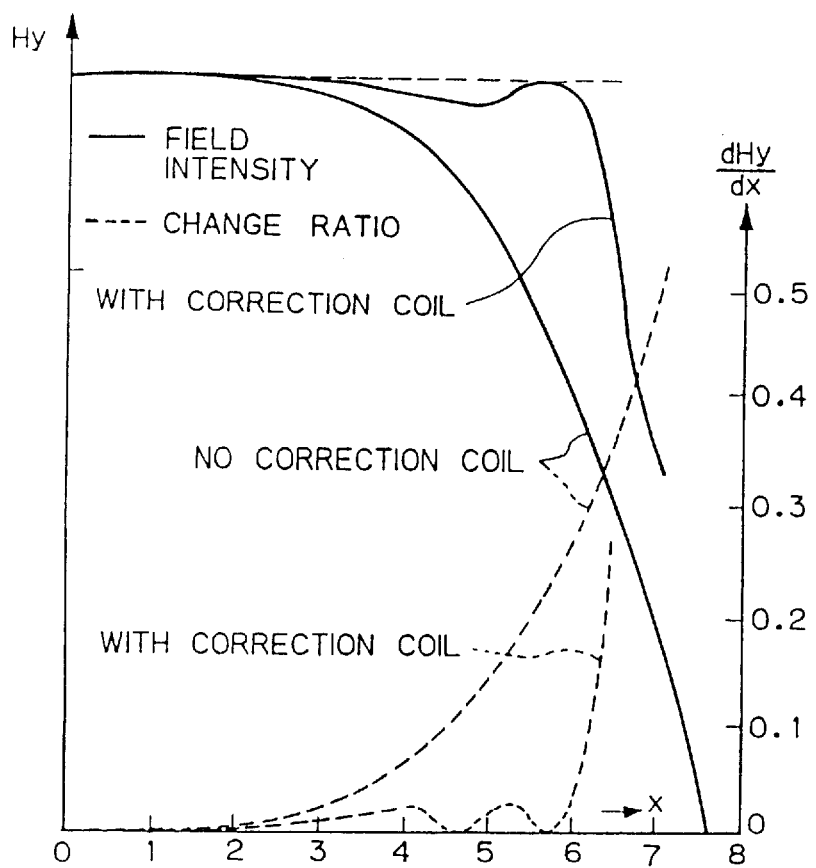

Considering ¼ of the cross-section of the magnetic pole 110 as shown in FIG. 4A, the test data regarding the change (along the x-axis direction) in the field intensity Hy in this cross-section with respect to the x-axis direction and the change ratio (dHy/dx) of the field intensity are shown in FIG. 4B. Here, the x-axis direction and the y-axis direction are the same as those shown in FIGS. 1 and 2. The abscissa in the graph shown in FIG. 4B has a unit scale corresponding to ⅛ of the radius of the magnetic pole 110. A half angle $\theta$ of the wide angle of the deflection coil is 60 degrees. For comparison's sake, the test data in case of no correction coil 15 are also shown. As apparent from the graph, in case of no correction coil, the field intensity starts to be decreased from a position slightly spaced apart from the center of the deflector. To the contrary, when the correction coils 15 are provided and the currents applied thereto are properly adjusted, the field intensity can be maintained substantially uniformly from the center to the vicinity of both ends of the visual field. More specifically, when the visual field 20 at the mask side has a rectangular dimension of 80 mm×1 mm and an area 21 is defined to have margins of 10 mm in both longitudinal and widthwise directions of the visual field and when the positions $X_h$, $y_h$ and the coil widths $\Delta x$, $\Delta y$ of the correction coils are selected to 5, 1 and, 0.5, 0,1, respectively, and the number of windings of each correction coil is the same as that of the deflection coil 14 and further when the current applied to each correction coil 15 is greater than that of each deflection coil 14 by 1.3 times, it was found that the change ratio of the deflection sensitivity can be suppressed to 3% or less per ⅛ of the inner radius of the magnetic pole within a range between ⅝ and ⅝ of the inner radius of the magnetic pole 110.

In the illustrated embodiment, while the deflection coil means 14 is of saddle type, each deflection coil may comprise a toroidal coil. In such a case, it is necessary to form holes or slits in the magnetic pole 110 through which the windings of the coil are passed. Further, the positions of the correction coils 15 are not limited to those shown in FIGS. 1 and 2, but the correction coils may be disposed at positions where the deflection sensitivity should be corrected.

As mentioned above, in the illustrated embodiment, since the change in the deflection sensitivity can be suppressed by overlapping the correction magnetic fields generated by the correction coil means with the deflection magnetic field generated by the deflection coil means, even if the wider space (range) in the deflection coil means than the conventional techniques is used for the deflection purpose, it is possible to limit the deflection distortion within a predetermined range. Thus, the deflector can be made more compact. Particularly, in charged particle beam transferring apparatuses using the deflector according to the present invention, since the deflector can be disposed within the magnetic pole of the projection lens efficiently and the bore radius of the lens magnetic pole can be decreased, the incident angle of the charged particle beam to the photosensitive substrate can be approached to 90 degrees, thereby improving the transferring accuracy.

More specifically, since the magnetic pole 110 nearest to the mask 10 has the inner diameter greater than those of the other magnetic poles, the deflection coil means 14 and the correction coil means 15 can be disposed efficiently in the available space within the magnetic pole 110. Since the inner diameter of the deflection coil means 14 can be decreased, there is no need to increase the bore radius of the magnetic pole 110 for installation of the deflection coil means 14. Accordingly, it is possible to suppress the influence of the magnetic field generated by the magnetic pole 110 upon the incident angle of the charged particle beam, thereby approaching the incident angle of the charged particle beam incident on the mask toward 90 degrees.

Next, a second embodiment of the present invention will be explained with reference to FIGS. 7 to 9.

Figure 7:
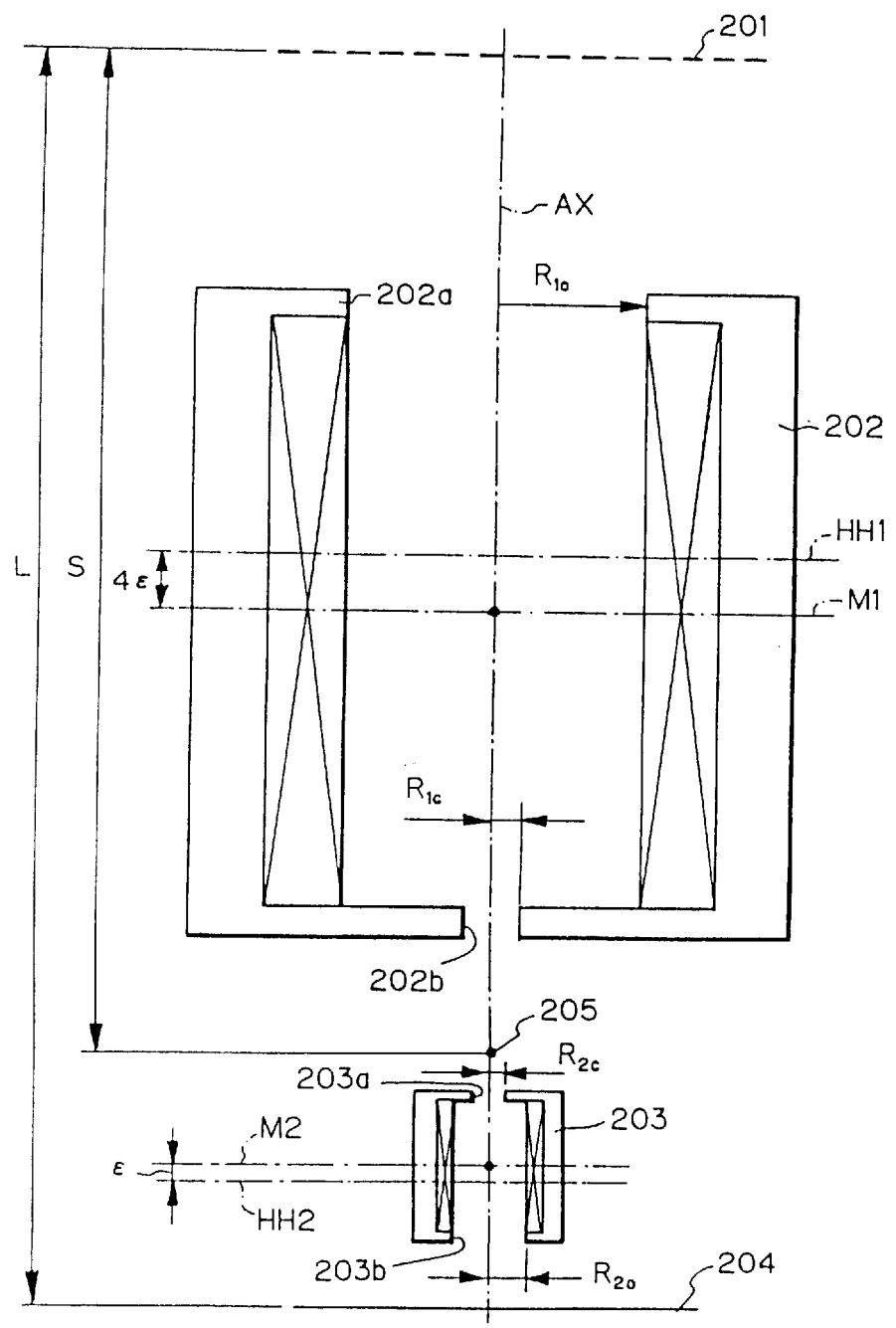
FIG. 7 is a schematic illustration showing a symmetrical magnetic doublet optical system of a charged particle beam reduction-transferring apparatus according to a second embodiment of the present invention.

FIG. 7 shows a symmetrical magnetic doublet optical system of a charged particle beam reduction-transferring apparatus according to a second embodiment of the present invention. The apparatus includes a mask 201, a first electromagnetic projection lens 202, a second electromagnetic projection lens 203, and a target 204. The reference numeral 205 denotes a cross-over point. Above the mask 201, there are disposed an electronic gun, a condenser and a visual field selecting deflector, which are not shown. With this arrangement, an electron beam is selectively directed onto one of a plurality of sub-fields (small-regions) formed on the mask 201. The electron beam passed through the mask 201 is focused on the cross-over 205 by means of the first projection lens 202, and the electron beam diverged from the cross-over is focused on the target 204 by means of the second projection lens 203. Consequently, the pattern image of the sub-field on the mask 201 is transferred onto the target 204 with predetermined reduction ratio of 1/n. Although the reduction ratio 1/n can be determined appropriately, in the illustrated embodiment, the reduction ratio is selected to ¼. In FIG. 7, an optical axis of the optical system is designated by "AX".

The cross-over 205 is a position (point) obtained by internally dividing a distance between the mask 201 and the target 204 with the reduction ratio of 1/n. That is to say, when the distance between the mask 201 and the target 204 is L and a distance between the mask 201 and the cross-over 205 is S, the following relation (1) is established:

$$S=L \cdot n/(n+1) \tag{1}$$

As mentioned above, in the illustrated embodiment, since n=4, the distance S becomes 4L/5 (i.e. S=4L/5).

Figure 8:
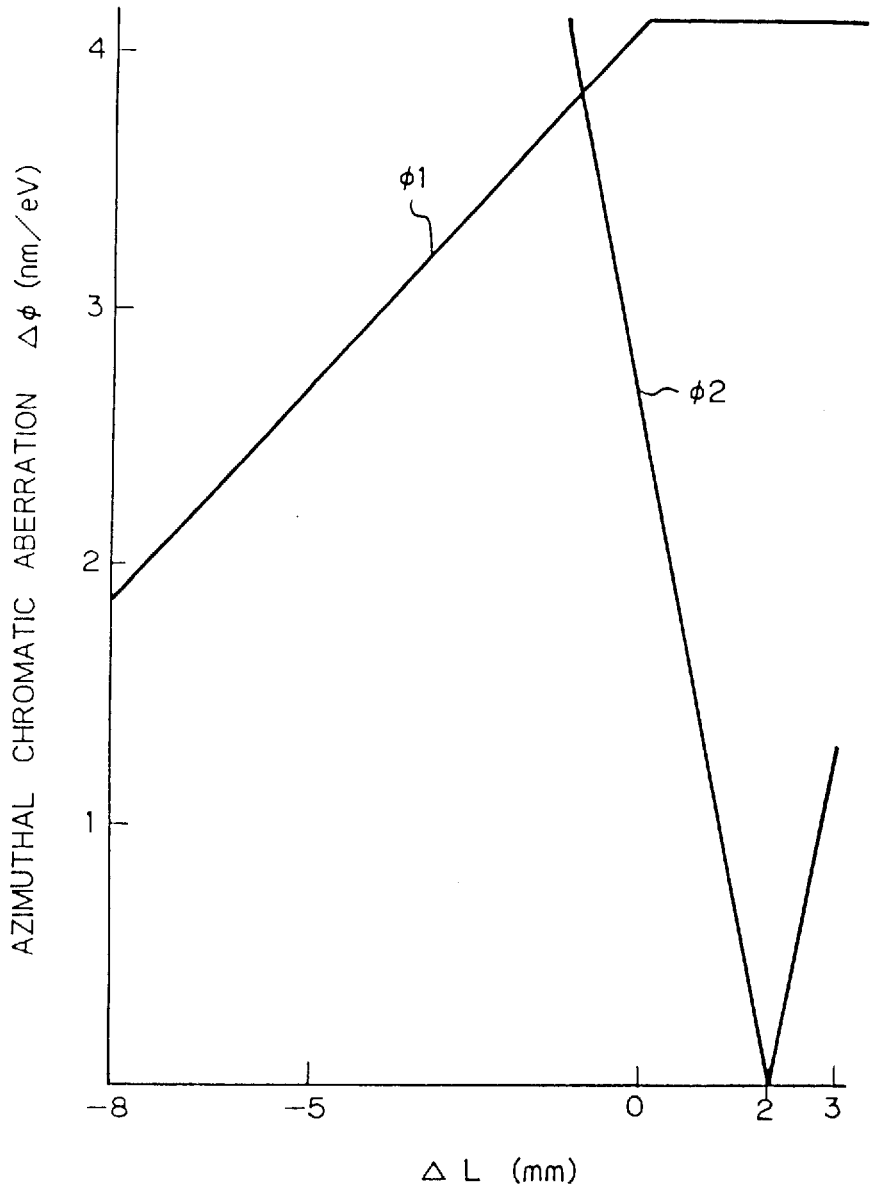
FIG. 8 is a graph showing a relation between a distance $\Delta L$ (between the position bisecting the distance between the cross-over and a target, and a center line position of a second projection lens at the target side) and azimuthal chromatic aberration $\Delta \Phi$.

FIG. 8 is a graph showing a relation between a distance $\Delta L$ (the distance between a position bisecting the distance between the cross-over and the target, and a center line position of the second projection lens, i.e. projection lens at the target side) and azimuthal chromatic aberration $\Delta\Phi$, which was calculated by the inventors. The abscissa in the graph indicates the distance $\Delta L$ (a direction that the second projection lens approaches the target is "positive" and a direction that the second projection lens leaves the target is "negative"). In FIG. 8, the solid line $\Phi 2$ represents the chromatic aberration regarding paraxial path calculated on the basis of the distribution of the magnetic field of the lens in the optical axis direction and its first differentiation. That is to say, the solid line $\Phi 2$ indicates a value obtained by seeking aberration coefficient on the basis of deviation of the path at an image point when beam energy is slightly changed in the paraxial path and by multiplying the aberration coefficient by magnitude of the visual field. As can be seen from the graph, if it is assumed that the entire electron beam is in the paraxial path, when $\Delta L=2$ mm (i.e. when the center line position of the second projection lens is shifted toward the target by 2 mm from the position bisecting the distance between the cross-over and the target), the aberration can be minimized. Accordingly, regarding the first projection lens, the center line position of the first projection lens may be shifted toward the mask by an amount of 2 n (obtained by multiplying he reciprocal n of the reduction ratio 1/n) form the position bisecting the distance between the mask and the cross-over.

However, since the electron beam directed to a peripheral portion of the visual field (particularly, a main visual field when field-division is effected) in the electron beam reduction-transferring apparatus is greatly spaced apart from the optical axis of the electron beam optical system, it cannot be assumed that the electron beam is in the paraxial path. Thus, by calculating the chromatic aberration on the basis of the actual path of the electron beam, the result shown by the solid line $\Phi 1$ in FIG. 8 was obtained. As apparent from this result, in the electron beam reduction-transferring apparatus, the chromatic aberration is decreased as the central position of the second projection lens approaches from the position bisecting the distance between the cross-over and the target toward the cross-over. Accordingly, also when the central position of the first projection lens approaches toward the cross-over from the position bisecting the distance between the mask and the cross-over, the chromatic aberration can be decreased. And, when the second projection lens is shifted toward the cross-over by an amount of $\epsilon$ (>0), by shifting the first projection lens toward the cross-over by an amount of n·$\epsilon$ (where the pattern reduction ratio is 1/n between the mask and the target), the chromatic aberration can be reduced.

Figure 9:
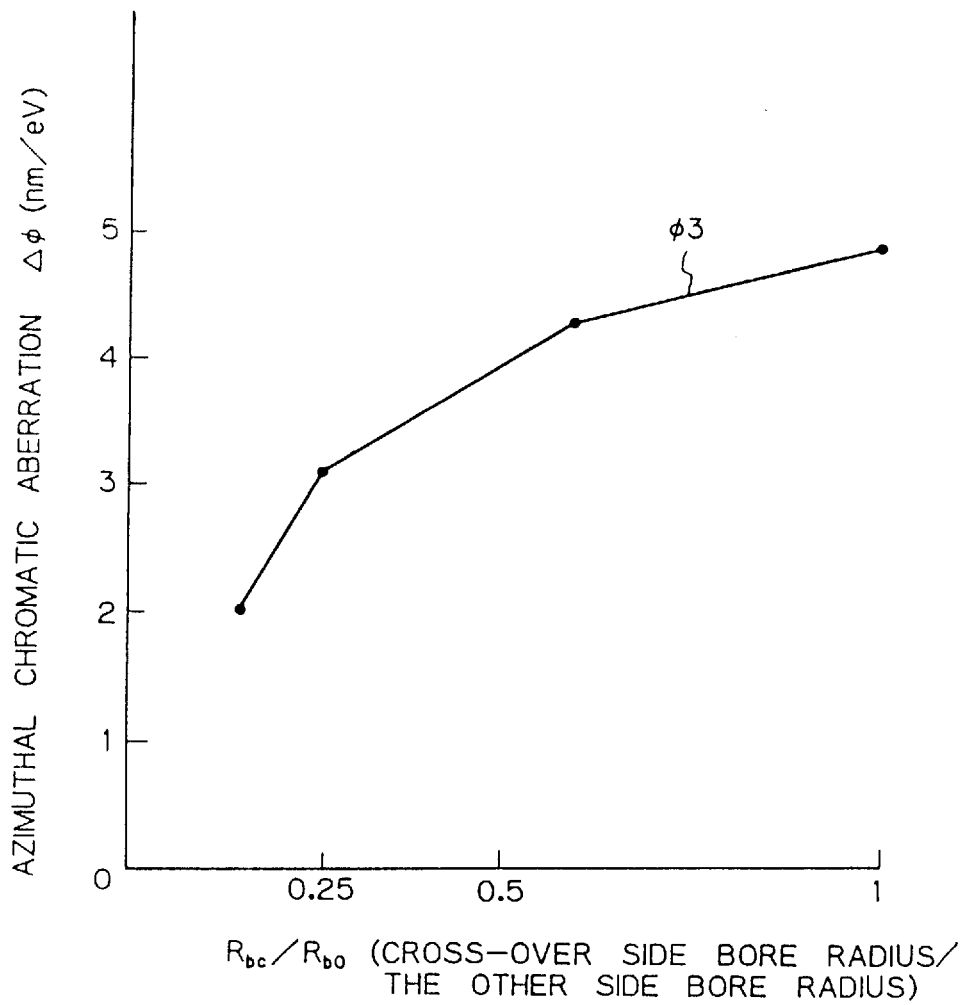
FIG. 9 is a graph showing a relation between a ratio of the bore radius $R_{bc}$ of the projection lens at the cross-over side to the bore radius $R_{bo}$ at the other side and the transverse chromatic aberration $\Delta \Phi$.

Next, when the inventors calculated a relation between the ratio $R_{bc}/R_{bo}$ (between the bore radius $R_{bc}$ of the projection lens at the cross-over side and the bore radius $R_{bo}$ at the other side) and the chromatic aberration $\Delta\Phi$, the result shown by the solid line $\Phi 3$ in FIG. 9 was obtained. From this result, it was found that the chromatic aberration can be minimized by setting the bore radius $R_{bc}$ at the cross-over side to become smaller than ¼ of the bore radius $R_{bo}$ at the other side. By satisfying the above requirements, the chromatic aberration can be reduced. Since the radial aberration is smaller than ½–⅓ of the azimuthal aberration $\Delta\Phi$ and is changed in the same manner as the change in the chromatic aberration shown in FIGS. 8 and 9, the above-mentioned results regarding the azimuthal aberration can be applied to the radial aberration.

According to the above requirements, in the example shown in FIG. 71 the center line position M1 of the first projection lens 202 (position bisecting the distance between the magnetic poles 202a and 202b) is displaced from the position HH1 bisecting the distance between the mask 201 and the cross-over 205 toward the cross-over 205, and the center line position M2 of the second projection lens 203 (position bisecting the distance between the magnetic poles 203a and 203b) is displaced from the position HH2 bisecting the distance between the cross-over 205 and the target 204 toward the cross-over 205. When a displacement amount of the second projection lens 203 is $\epsilon$ (>0), a displacement amount of the first projection lens 202 is set to the reciprocal multiple of the reduction ratio ¼ (i.e. 4$\epsilon$). he bore radius $R_{1c}$ of the magnetic pole 202b (at the 205 side) of the first projection lens 202 is set to ¼ of the bore radius $R_{1c}$ of the magnetic pole 202a at the other side, and the bore radius $R_{2c}$ of the magnetic pole 203a (at the cross-over 205 side) of the second projection lens 203 is set to ¼ of the bore radius $R_{2o}$ of the magnetic pole 203b at the other side.

With this arrangement, when $\epsilon$=8 mm, $R_{1c}$=20 mm, $R_{1o}$=80 mm, $R_{2c}$=5 mm and $R_{2o}$=20 mm and when the dimension of the main visual field on the target 204 is set to 20 mm×20 mm, from the calculation result of the chromatic aberration, it was ascertained that the azimuthal aberration can be reduced below 2 nm/eV. Further, even when the divergence of energy emitted from the electronic gun is 5 eV, it was found that the deterioration of beam resolving power due to the azimuthal chromatic aberration can be suppressed below 10 nm. Therefore, according to the illustrated embodiment, the pattern of the semiconductor element having a width of the shorter side of 20 mm or less can be transferred accurately without interconnecting the main visual fields.

As mentioned above, according to the present invention, the radial and azimuthal chromatic aberrations can be adequately reduced by installing the first and second projection lenses at optimum positions along the optical axis in consideration of the actual path of the electron beam and by appropriately selecting the bore radii of these projection lenses. Accordingly, even when the energy of the electron beam emitted from the electronic gun has divergence, the deterioration of the beam resolving power can be suppressed, with the result that the transferring can be performed with high through-put by enlarging the visual field of the optical system while maintaining the transferring accuracy. Further, any electronic gun for emitting an electron beam having a relatively large energy width can be used without considering a problem regarding chromatic aberrations.

Next, a third embodiment of the present invention will be explained with reference to FIGS. 10 to 17.

Figure 10:
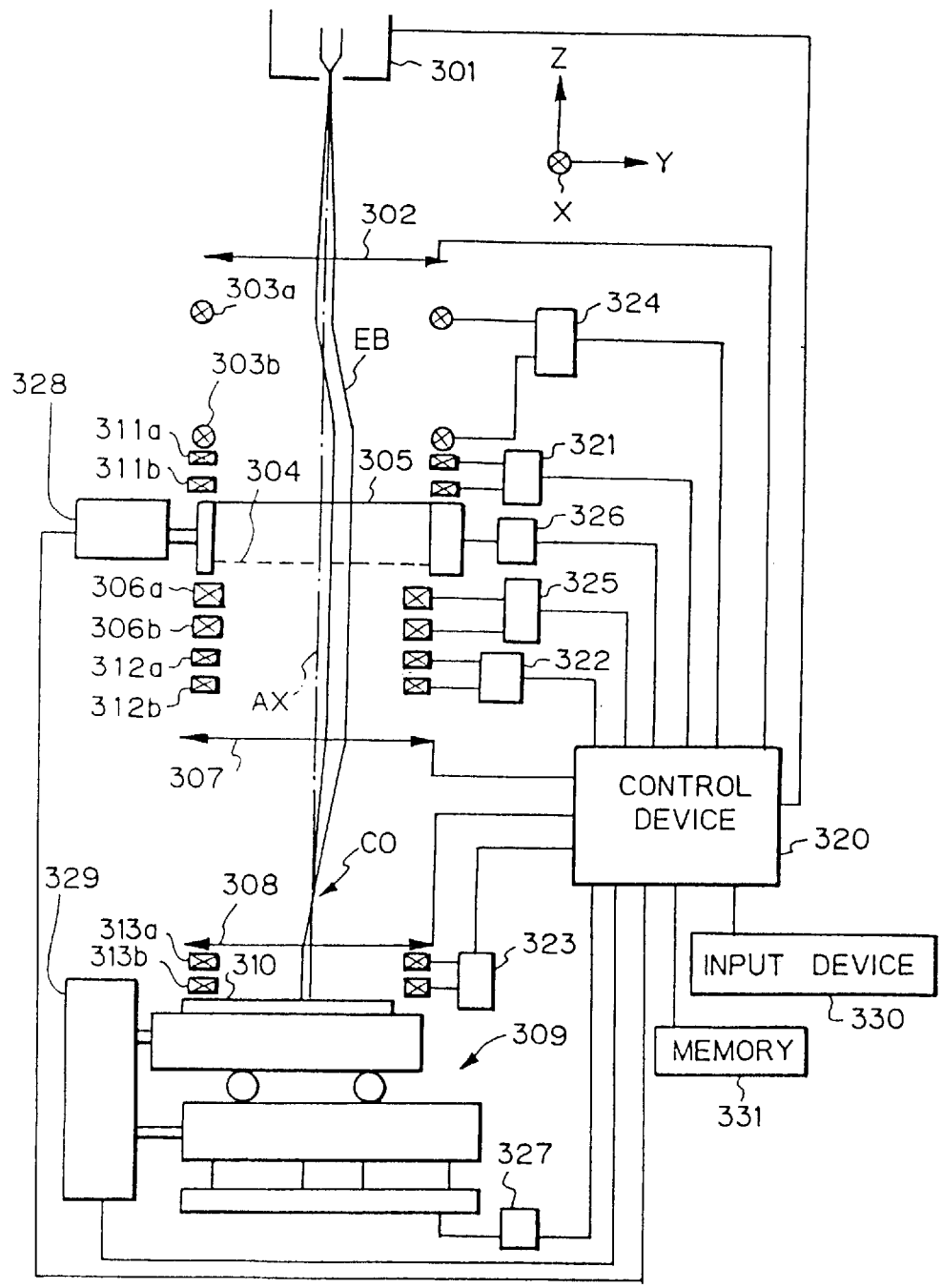
FIG. 10 is a schematic illustration showing a transferring apparatus according to a third embodiment of the present invention.

FIG. 10 schematically shows an electron beam reduction-transferring apparatus according to the third embodiment of the present invention, which comprises an electronic gun 301, a condenser lens 302 for collimating an electron beam emitted from the electronic gun 301, a two-stage visual field selecting deflector means 303a, 303b for directing the electron beam EB passed through the condenser lens 302 to a predetermined position on a mask 304, a mask stage 305 for holding the mask 304, a two-stage transfer position correcting deflector means 306a, 306b for deflecting the electron beam passed through the mask 304 by a predetermined amount, a first projection lens 307, a second projection lens 308, and a wafer stage 309 on which a wafer 310 is mounted. The mask 304 will be fully described later. The mask stage 305 can be shifted in an x-axis direction (direction perpendicular to the plane of FIG. 10) and a y-axis direction. The wafer stage 309 can be shifted horizontally in the x-axis direction and the y-axis direction and can also be lifted and lowered in a z-axis direction. The z-axis direction coincides with a direction parallel to optical axes AX of the first and second projection lenses 307, 308, and the x-axis direction and the y-axis direction are orthogonal to each other in a plane perpendicular to the z-axis direction. An x-axis direction, a y-axis direction and a z-axis direction shown in FIGS. 11 to 14 are determined in the same manner as FIG. 10.

The above-mentioned arrangement is included in the conventional transferring apparatus. The transferring apparatus according to this third embodiment has the following characteristic arrangement. That is to say, in the illustrated embodiment, two-stage angle adjusting deflector means 311a, 311b are disposed above the mask 304 and two-stage angle adjusting deflector means 312a, 312b are disposed below the mask, and two-stage angle adjusting deflector means 313a, 313b are disposed in front of the wafer stage 309. Although these sets of deflector means 311a, 311b, 312a, 312b, 313a, 313b serve to deflect the electron beam in the y-axis direction, other sets of similar deflector means (not shown) are also provided to deflect the electron beam in the x-axis direction. The reason for the provision of two sets of deflector means will be described later. By the above deflector means 311a, 311b, 312a, 312b, 313a, 313b, an angle of the electron beam is adjusted to simultaneously satisfy a condition that the electron beam incident on the mask 304 and the wafer 310 becomes perpendicular to the latter and a condition that a main light beam of the electron beam passed through the first projection lens 307 passes through the cross-over CO. The details will be described later.

The deflection sensitivity of each of the deflector means 311a, 311b, 312a, 312b, 313a, 313b is independently controlled by means of a control device 320 via interfaces 321, 322, 323. The control device 320 serves to control the entire operation of the transferring apparatus, and, more specifically, it controls the deflection sensitivity of each angle adjusting deflector means. It also controls setting conditions of the electronic gun 301, condenser lens 302, first projection lens 307 and second projection lens 308, as well as the deflector means 303a, 303b and 306a, 306b via interfaces 324, 325, respectively, and also controls operations of actuators 326, 327 for the mask stage 305 and the wafer stage 309. The position of the mask stage 305 in the x-axis and y-axis directions and the position of the wafer stage 309 in the x-axis, y-axis and z-axis directions are detected by position detectors 328, 329, respectively, and the detected information is sent to the control device 320. The reference numeral 330 denotes an input device for inputting various data such as a transferring condition to the control device 320; and 331 denotes a memory.

Figure 11:
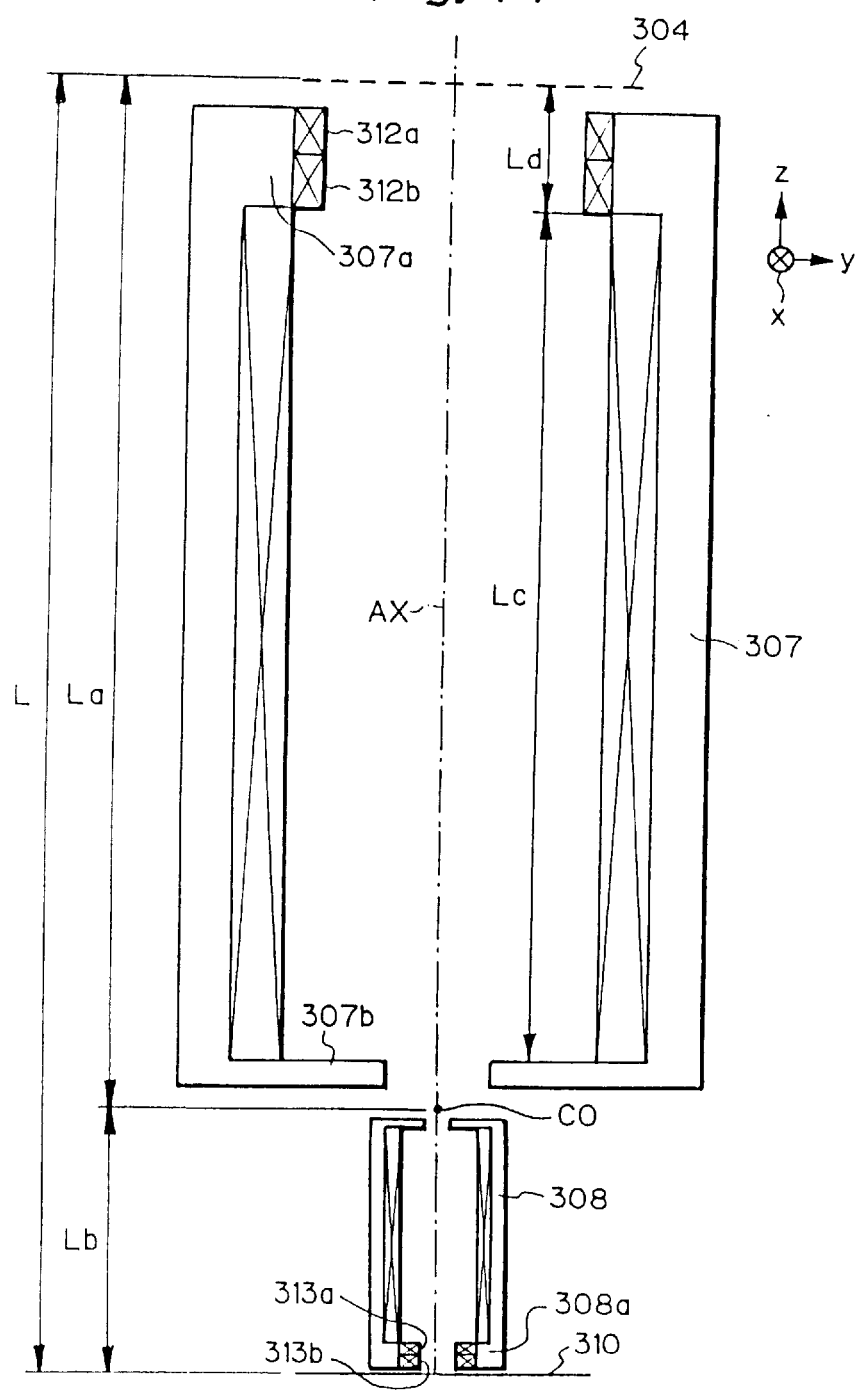
FIG. 11 is an enlarged view of the projection lens and therearound.

FIG. 11 schematically shows the optical system between the mask 304 and the wafer 310. However, the deflector means 306a, 306b shown in FIG. 10 are omitted from illustration in FIG. 11. Coils of the angle adjusting deflector means 312a, 312b are disposed on an inner peripheral surface of a magnetic pole 307a (at the mask side) of the first projection lens 307, and coils of the angle adjusting deflector means 313a, 313b are disposed on an inner peripheral surface of a magnetic pole 308a (at the wafer side) of the second projection lens 308. When the distance between the mask 304 and the wafer 310 is L and the reduction ratio of the pattern from the mask 304 to the wafer 310 is 1/n, the distance La from the mask 304 to the cross-over CO of the first projection lens 307 becomes L·n/(n+1), and the distance Lb from the cross-over CO to the wafer 310 becomes L/(n+1).

When the distance between the magnetic poles 307a and 307b of the first projection lens 307 is Lc and the distance between the magnetic pole 307a and the mask 304 is Ld, the distortion generated during the transferring of the pattern is reduced as the distance Lc is increased and the magnetic field of the lens leaking toward the mask side is reduced as the distance Ld is increased, thereby improving the perpendicularity of the electron beam incident on the mask. That is to say, if the electron beam is incident on the mask 304 perpendicular thereto and angular adjustment (described later) is not effected by the deflector means 312a, 312b, a deviation amount between a position where the main light beam of the electron beam passed through the first projection lens 307 intersects with the optical axis AX and the cross-over CO is reduced as the distance Ld is increased. However, since the distance L is naturally limited due to the limited dimension of a lens barrel of the optical system and the distance La between the mask 304 and the cross-over CO is also limited, as the distance Ld is increased the distance Lc is decreased accordingly, with the result that the distortion cannot be improved. Regarding the second projection lens 308, the same problem occurs as understood when considering an arrangement where the mask 304 is replaced by the wafer 310. Thus, in the illustrated embodiment, the angle of the electron beam is adjusted by the above-mentioned deflector means 311a, 311b, 312a, 312b, 313a, 313b in accordance with the principle shown in FIG. 12.

Figure 12:
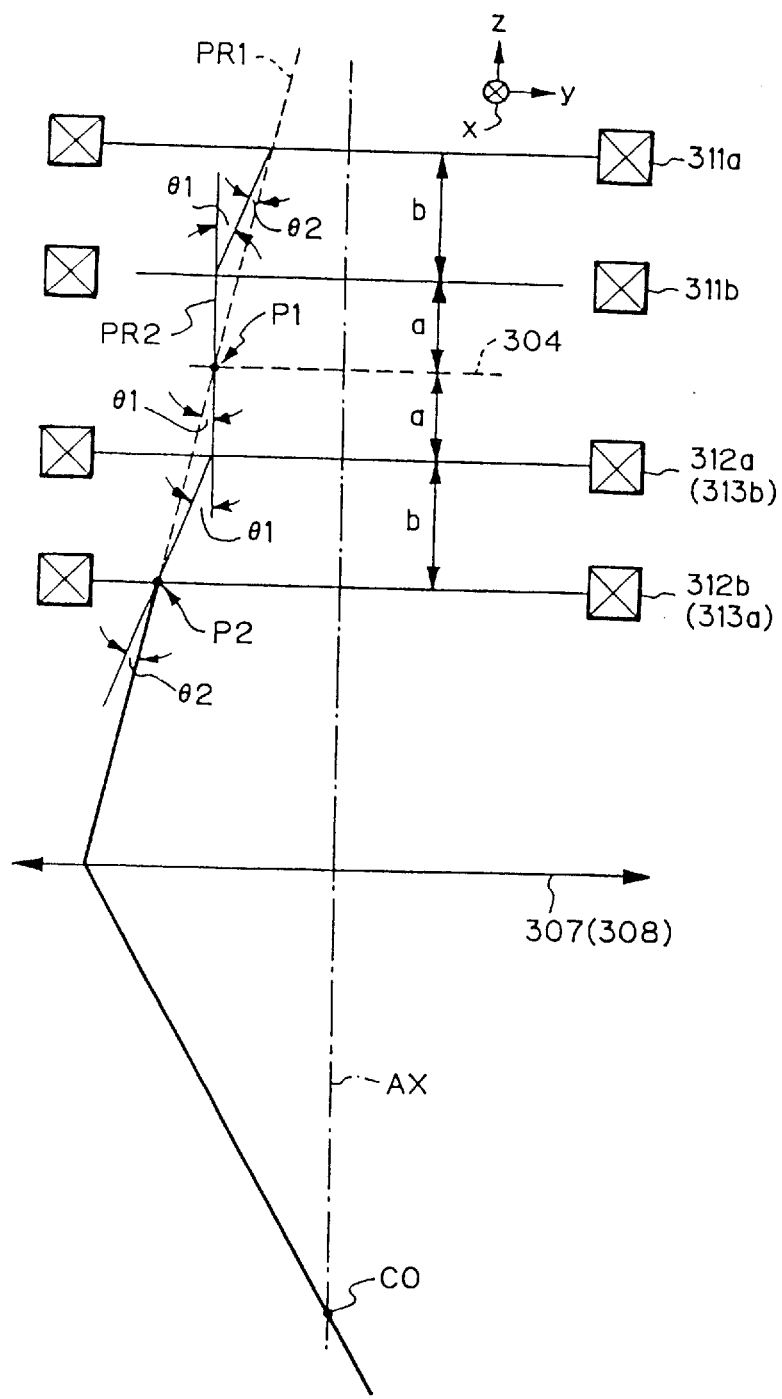
FIG. 12 is a view showing a principle of angular adjustment in the apparatus according to the third embodiment.

In FIG. 12, the broken line PR1 represents the main light beam of the electron beam if the angle adjustment is not effected by the deflector means 311a, 311b, 312a, 312b, and the solid line PR2 represents the main light beam of the electron beam when the angle adjustment is effected by the deflector means 311a, 311b, 312a, 312b. The distance "a" between the mask 304 and the deflector 311b is the same as the distance "a" between the mask and the deflector 312a, and the distance "b" between the deflector 311b and the deflector 311a is the same as the distance "b" between the deflector 312a and the deflector 312b. At the downstream side of the center position P2 of the deflector 312b in the optical axis direction, the main light beam PR1 and the main light beam PR2 pass through the cross-over CO through the same path.

As apparent from FIG. 12, if the angle adjustment according to the illustrated embodiment is not effected, the main light beam PR1 passed through the visual field selecting deflector means 303a, 303b will be incident on the mask 304 in a condition that it is inclined by an angle θ with respect to the z-axis direction (parallel with the optical axis AX) toward a direction spaced away from the optical axis AX. To the contrary, in the illustrated embodiment, the main light beam PR2 is first deflected outwardly by an angle θ2 by means of the uppermost deflector 311a and then is deflected inwardly by an angle θ1 by means of the next deflector 311b so that the main light beam PR2 is incident on the mask 304 perpendicular thereto. In this case, the incident position of the main light beam PR2 to the mask 304 coincides with the incident position P1 of the main light beam PR1. Then, the main light beam PR2 passed through the mask 304 is deflected outwardly by the angle θ1 by means of the deflector 312a so that the main light beam passes through the center position P2 of the deflector 312b at the same point through which the beam PR1 passes. Thereafter, the main light beam PR2 is deflected inwardly by the angle θ2 so that the main light beam PR2 can path along the same path as the main light beam PR1. In this case, the starting point of the main light beam PR2 to be deflected by the deflectors 312a, 312b is the point P1 on the mask 304.

Regarding the wafer 310, an arrangement obtained when FIG. 12 is turned upside down and the first projection lens 307 and the mask 304 are replaced by the second projection lens 308 and the wafer 310, respectively, may be considered. The corresponding reference numerals in case of this imaginary arrangement are indicated in the parentheses. At the wafer 310 side, since the main light beam passed through the second projection lens 308 is inclined by the angle θ with respect to the z-axis direction toward a direction approaching the optical axis AX, the main light beam is first deflected inwardly by the angle θ2 by means of the deflector 313a and then is deflected outwardly by the angle θ1 so that the incident angle of the beam to the wafer 310 is 90 degrees. In this case, the incident position of the main light beam to the wafer 10 can coincide with the incident position obtained if the angle adjustment is not effected.

Next, a method for setting the deflection sensitivity when the angle adjustment is effected will be explained.

As apparent from FIG. 12, the following equations (1) and (2) can be established:

$$\theta_1 = \theta_2 + \theta \tag{1}$$

$$(a+b) \cdot \theta = \theta_1 \cdot b \tag{2}$$

By solving the above simultaneous equations (1), (2) to remove or delete "θ", the following equation (3) can be obtained:

$$(a+b) \cdot (\theta_1 - \theta_2) = \theta_1 \cdot b$$

Therefore, $$\theta_2/\theta_1 = a/(a+b) \tag{3}$$

From the above, the deflection sensitivity of each of the deflectors 311a, 311b, 312a, 312b can be set to have a ratio shown by the equation (3). However, as apparent from FIG. 12, θ1 and θ2 have opposite signs.

In the equation (3), θ1 and θ2 (and θ) are unknown quantities. Now, a method for seeking these values θ1, θ2 will now be explained.

First of all, from the equation (2), the following equation (4) can be derived:

$$\theta_1 = ((a+b)/b) \cdot \theta \tag{4}$$

From the equations (4) and (3), the θ2 can be determined as follows:

$$\theta_2 = ((a+b)/b) \cdot (a/(a+b)) \cdot \theta = a \cdot \theta/b \quad (5)$$

Thus, when the value of θ is determined, the values θ1, θ2 can be calculated.

Figure 13:
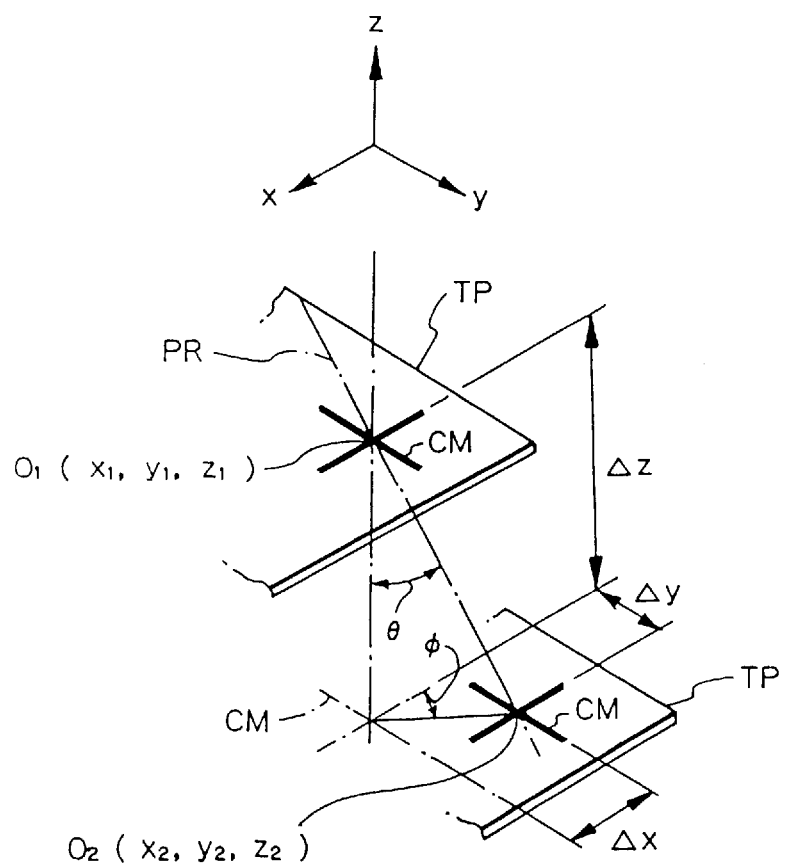
FIG. 13 is a view for explaining a procedure for seeking inclination $\theta$ of a beam.

The angle θ is actually measured as the incident angle of the main light beam incident on the wafer. For example, the measurement is performed as shown in FIG. 13. First of all, a test piece TP having a crisscross marker CM formed thereon is rested on the wafer stage 309 (FIG. 10). Then, while the route or path of the electron beam is being kept constant, the test piece TP is shifted in the x-axis and y-axis directions between two positions spaced apart from each other by an amount of Δz in the z-axis direction. Meanwhile, positions where the centers $O_1$, $O_2$ of crisscross of the marker CM coincide with the main light beam PR are determined by detecting electrons reflected from the test piece TP. The coordinates $(x_1, Y_1, z_1)$, $(x_2, Y_2, Z_2)$ of the centers $O_1$, $O_2$ are determined from the position of the wafer stage 309, and the inclination θ of the main light beam can be calculated on the basis of differences Δx, Δy, Δz in coordinates. Incidentally, a crisscross marker CM' shown by the two-dot chain line in FIG. 13 represents a case where the inclination θ of the main light beam is zero. If the main light beam PR passes through the cross-over CO as is in the main light beam PR1 of FIG. 12, the inclination θ provides a condition that the aberration is minimized when the incident position of the main light beam PR incident to the wafer 310 is positioned at the center $O_1$ or $O_2$.

In the example shown in FIG. 13, the main light beam PR is inclined by an angle Φ with respect to the x-axis direction. On the other hand, as mentioned above, the angle adjustment effected by the deflectors is limited to the X-axis and Y-axis directions. Thus, in order to determine the actual deflection sensitivity, the inclination θ is divided into inclination (Δx/Δz) in the x-axis direction and inclination (Δy/Δz) in the y-axis direction, and inclination values θ obtained for x-axis and y-axis are entered into the above equations (4) and (5). In this way, the perpendicularity of the electron beam in the rotational direction and the perpendicularity of the electron beam in the radial direction can be satisfied simultaneously.

In this way, the deflection sensitivity of each of the deflectors 311a, 311b, 312a, 312b, 313a, 313b (when the perpendicular incident condition of the electron beam to the mask 304 and the wafer 310 and the condition that the main light beam passes through the cross-over are simultaneously satisfied) is determined in correspondence to the incident position of the electron beam to the wafer 310. The obtained relations between respective deflection sensitivity and the incident position are previously stored in the memory 331 of FIG. 10. Since the optimum value of the deflection sensitivity is varied with the incident position of the electron beam to the wafer 310, the deflection sensitivity is previously determined regarding all of the incident positions during the actual transferring.

Figures 14A, 14B:
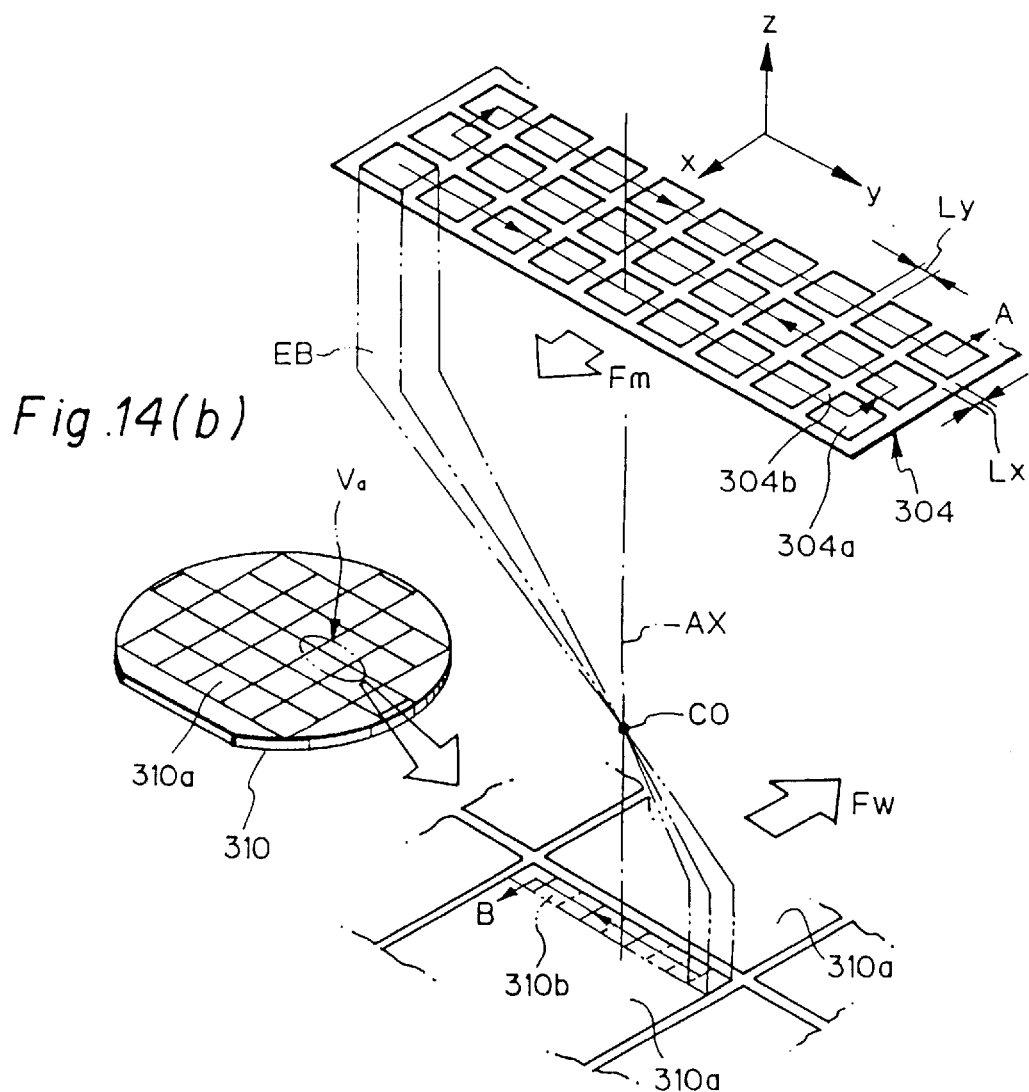
FIG. 14 is a schematic illustration showing a relation between the mask and wafer during the transferring in the apparatus of FIG. 10.
Figure 15A:
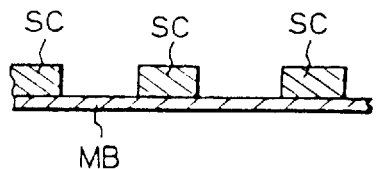
FIGS. 15A and 15B are views showing various kinds of masks.
Figure 15B:
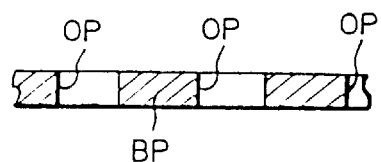

Next, a transferring sequence effected by the transferring apparatus according to the illustrated embodiment will be described. FIG. 14 schematically shows a relation between the mask 304 and the wafer 310 during the transferring. In FIG. 14, the lenses and deflectors are omitted from illustration. As apparent from the section (a) in FIG. 14, the mask 304 has a plurality of rectangular small regions 304a, and bordering regions 304b bordering the small regions in a grid pattern. A pattern (the details of which is not illustrated) to be transferred to an area 310a (corresponding to one chip, i.e. one semiconductor) (referred to as "chip area" hereinafter) on the wafer 310 is divided into pattern segments, and these pattern segments are formed on the corresponding small regions 304a. The electron beam transferring mask may be formed by disposing scattering elements SC capable of scattering the electron beam at a large scattering angle on a thin film MB having high permeability to the electron beam to form the pattern, as shown in FIG. 15A, or may be formed by forming openings OP corresponding to the pattern in a substrate BP blocking the electron beam, as shown in FIG. 15B. In the illustrated embodiment, either of the mask of FIG. 15A or 15B can be used. In any cases, the bordering regions 304b are uniformly formed from the material capable of blocking the electron beam or greatly scattering the electron beam. The configuration of the wafer 310 is as shown in the section (b) in FIG. 14, and a portion (a portion Va in the section (b) in FIG. 14) of the wafer 310 is shown in the section (a) in FIG. 14 with an enlarged scale.

The electron beam EB emitted from the electronic gun 301 of FIG. 10 is formed to have a square cross-section slightly greater than the small region 304a, and is deflected by means of the visual field selecting deflectors 303a, 303b by a predetermined amount so that it is directed to one of the small regions 304a on the mask 304. The pattern segment formed on each small region 304a is reduction-transferred onto a unit area 310b within the chip area 310a on the wafer 310 through the projection lenses 307, 308 of FIG. 10. That is to say, in the illustrated embodiment, the small region 304a corresponds to the sub-field at the mask side, and the unit area 310b corresponds to the sub-field at the wafer side. The selection of the small region 304a is effected in the following manner.

During the transferring operation, as shown by the arrows Fm, Fw, the mask 304 and the wafer 310 are continuously shifted in opposite directions along the x-axis direction. When a given row of small regions 304a disposed side by side along the y-axis direction reaches the transferring start position, by these continuous movements, the electron beam EB is scanned step by step in the y-axis direction by a pitch in the row of the small regions 304a so that the small regions 304a disposed side by side along the y-axis direction are successively illuminated by the electron beam EB. In synchronous with the scanning of the electron beam, the electron beam EB is deflected in the y-axis direction by means of the deflectors 306a, 306b of FIG. 10 by an amount corresponding to the width (in the y-axis direction) of the bordering region 304b, with the result that the pattern images formed on the row of small regions 304a disposed side by side along the y-axis direction are successively transferred onto the wafer 310 along the y-axis direction. After the transferring of the pattern images on the row of the small regions 304a is finished, when a next row of small regions 304a adjacent to the previous row in the x-axis direction reaches the transferring start position, the transferring of the next row is started. In this way, the pattern images formed on all of the small regions 304a of the mask 304 are transferred to the chip area 310a of the wafer 310.

Figure 16:
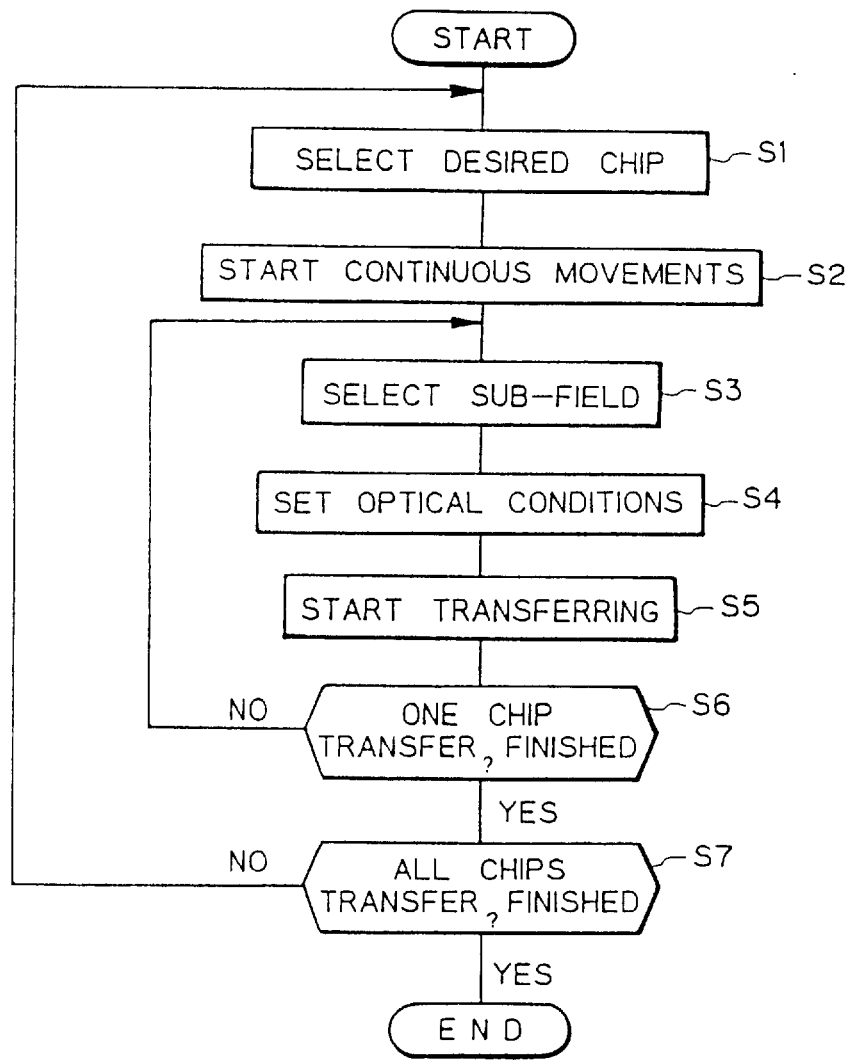
FIG. 16 is a flow chart showing a control sequence of a control device when the transferring is effected in a manner shown in FIG. 14.

FIG. 16 is a flow chart showing a control sequence of the control device 320 when the pattern is transferred to the whole area on the wafer. When the wafer 310 is mounted on the wafer stage 309 and the transferring start command is inputted, the control device 320 selects the chip area 310a to which the pattern images are to be transferred (step S1) and the wafer stage 309 is driven so that the selected area 310a is brought to a predetermined position. Then, in a step S2, the mask 304 and the wafer 310 are continuously shifted by the mask stage 305 and the wafer stage 309. In the next step S3, the sub-field, i.e. the small region 304a to be illuminated by the electron beam is selected. The order of selection of the area 310a and the small region 304a is previously inputted from the input device 330 to the control device 320.

After the sub-field is selected, the sequence goes to a step S4, where the optical conditions are set in accordance with the sub-field. The optical conditions include operating conditions of the lenses 307, 308 and the deflectors 303a, 303b, 306a, 306b, operating conditions of the angle adjusting deflectors 311a, 311b, 312a, 312b, 313a, 313b and the like. That is to say, when the small region 304a from which the pattern is to be transferred is determined, since the position of the corresponding area 310b on the wafer 310 can also be determined, the deflection sensitivity corresponding to this position is derived from the memory 331 and such deflection sensitivity is set. After the optical conditions are set, the sequence goes to a step S5, where the transferring is started. After the transferring of one small region 304a is finished, the sequence goes to a step S6, where it is judged whether the transferring of one chip area 310a is finished or not. If not, the sequence is returned to the step S3, where a next region to be transferred is selected among non-transferred regions. On the other hand, if affirmative, the sequence goes to a step S7, where it is judged whether the transferring of all of the chip areas 310a on the wafer 310 is finished or not. If not, the sequence is returned to the step S1, where the non-transferred chip area is selected as the transfer area. On the other hand, if affirmative, the sequence is ended.

Figure 17:
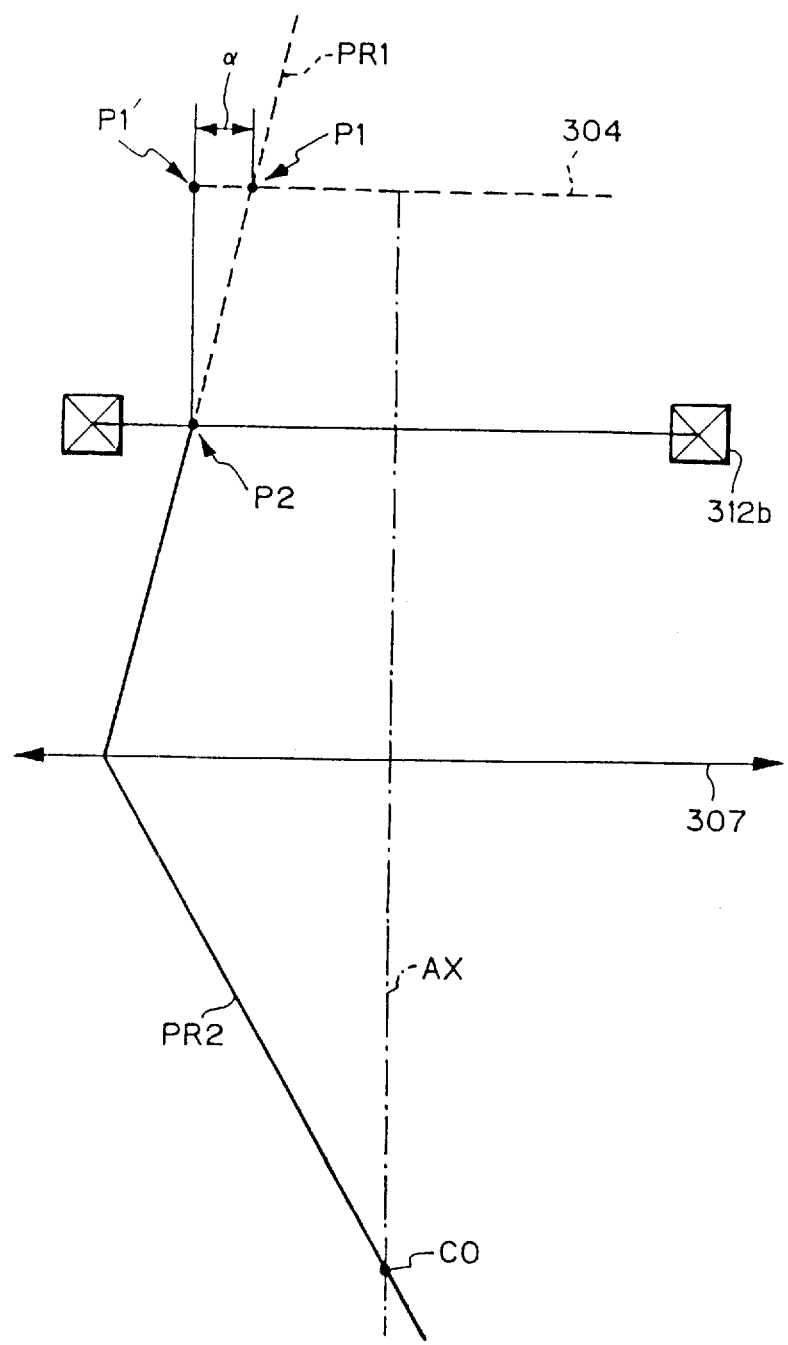
FIG. 17 is a view showing an example that an incident angle is adjusted by means of a single deflector.

As mentioned above, in the illustrated embodiment, since regarding all of the sub-fields, the condition as to the perpendicularity of the electron beam incident to the mask 304 and the wafer 310 and the condition that the main light beam passes through the cross-over are both satisfied, even if the mask 304 and/or the wafer 310 is displaced in the z-axis direction due to the warp and the like, the pattern error does not occur and the pattern can always be transferred with minimum distortion. Even when the magnetic poles 307a, 308a of the projection lenses 307, 308 are disposed near the mask 304 and the wafer 310, since the perpendicularity of the beam incident to the mask and the wafer can be ensured, the lenses 307, 308 themselves can be designed with low aberration. Since the angular adjustment is effected by means of the two-stage deflector means 312a, 312b at the mask 304 side and the two-stage deflector means 313a, 313b at the wafer 310 side with utilizing the positions of the mask 304 and the wafer 310 as the deflection centers, the incident position of the electron beam is not changed between before and after the angle adjustment is performed. That is to say, as shown in FIG. 17, if the electron beam incident on the mask is deflected only by the single stage deflector 312b to pass through the cross-over CO, since the incident position P1 of the electron beam to the mask 304 before the angle adjustment is deviated from the incident position P1' of the electron beam to the mask after the angle adjustment by an amount α, it is necessary to correct the incident position by shifting the mask 304 in the deflected direction by the amount α, thereby worsening the through-put accordingly. However, if the deviation α of the incident position can be corrected for a short time, the single stage deflector may be used.

Incidentally, when the mask having the thin film support structure as shown in FIG. 15A is used and when the thin film MB is formed from mono-crystal material and the crystal orientation providing the longest mean free path is aligned with the direction of the optical axis AX, by combining such a mask and the illustrated embodiment, the scattering of the charged particle beam passed through the thin film MB can be suppressed to the minimum extent.

As mentioned above, according to the present invention, by deflecting the charged particle beam by means of the angle adjusting deflector means, since the beam path (course) can be adjusted to the desired condition at the mask side and the target side while maintaining the condition that the main light beam of the charged particle beam passes through the cross-over, the condition regarding the perpendicularity of the charged particle beam incident to the mask and the target and the condition that the main light beam of the charged particle beam passes through the cross-over can be satisfied simultaneously, thereby effecting the transferring with high accuracy. Further, in the illustrated embodiments, the above-mentioned two conditions can be satisfied simultaneously regarding all of the sub-fields, the incident position of the charged particle beam to the mask and the target can be kept constant before and after the adjustment of the beam orbit, and the perpendicularity of the charged particle beam incident on the mask and the target in the radial direction and the perpendicularity in the circumferential direction can be adjusted regarding all of the sub-fields.

When the transferring is performed by using the mask shown in FIG. 14, if the pattern segments formed on a row of small regions 304a disposed side by side along the y-axis direction are merely projected on the wafer 310 through the pair of projection lenses, gaps each corresponding to the bordering region 304b will be generated between the transfer areas 310b (corresponding to the small regions 304a) on the wafer 310. To avoid this, it is necessary to deflect the electron beam EB passed through each small region 304a in the y-axis direction by an amount corresponding to the width Ly of the bordering region 304a to correct the pattern transfer position. Also regarding the x-axis direction, if the mask 304 and the wafer 310 are merely shifted at the constant speed depending upon the reduction ratio of the pattern, after the transferring of one row of small regions 304a is finished, when the next row of small regions 304a are transferred, it is necessary to deflect the electron beam EB passed through the small region in the x-axis direction by an amount corresponding to the width Lx of the bordering region 304b to prevent gaps (in the x-axis direction) from generating between the transfer areas 310b. However, when the electron beam passed through the mask 304 is deflected to correct the pattern transfer position on the wafer 310 as mentioned above, the maximum deflection amounts in the x-axis and y-axis directions are increased as the number of the small regions 304a is increased. Accordingly, when this deflecting technique is used with a lithographic apparatus for handling a semiconductor having a large surface area, a considerably large-sized deflector must be used, thereby making the optical system bulky. In addition, since the deflection amount is increased, the pattern distortion during the transferring is also increased, thereby worsening the transferring accuracy.

When the transferring operation as mentioned above is performed, the order for scanning the small regions 304a and the order for transferring the pattern segments onto the wafer 310 are as shown by the arrows A and B in the section (a) in FIG. 14.

Figures 18A, 18B:
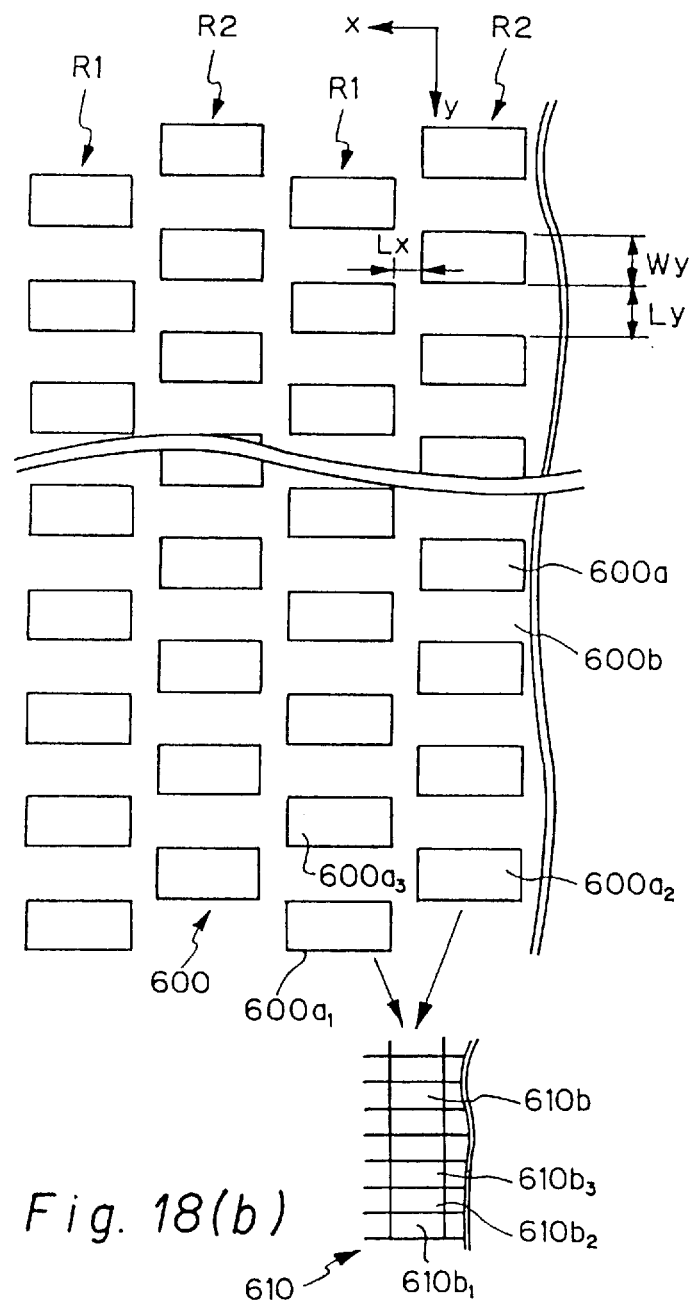
FIG. 18 is a view showing a relation between the mask and the wafer according to a fourth embodiment, where a section (a) is a partial plan view of the mask and a section (b) is a partial plan view of the wafer.

Next, a fourth embodiment of the present invention which can prevent the increase in deflection amount will be explained with reference to FIG. 18. FIG. 18 shows a relation between a mask and a wafer according to the fourth embodiment, where a section (a) is a partial plan view of the mask 600 and a section (b) is a partial plan view of the wafer 610. An x-axis direction and a y-axis direction are the same as those shown in FIG. 14. The mask 600 has a plurality of rectangular small regions 600a on each of which a pattern segment divided from a pattern (to be transferred) is formed, and bordering regions 600b bordering the small regions in a grid pattern and each having no pattern. In this mask 600, in the y-axis direction, a width Wy of the small region 600a is the same as a width Ly of the bordering region 600b. Further, regarding the y-axis direction, the small regions 600a in first rows R1 are aligned with the bordering regions 600b in adjacent second rows R2 or vice versa. A width Lx (in the x-axis direction) of the bordering region 600b is the same as that of FIG. 14.

In the mask 600, the pattern segments to be transferred onto the wafer 610 in one line along the y-axis direction are formed on the small regions 600a in each of the first and second rows R1, R2. And, a relation between the small regions 600a in one of the first rows R1 and the small regions 600a in the corresponding adjacent second row R2, and transfer areas 610b on the wafer 610 is so selected that all of the small regions 600a in the first row R1 and the second row R2 are transferred to the all of the transfer areas 610b in a single row while maintaining the positions of the small regions 600a in the y-axis direction unchanged. For example, when it is assumed that the pattern segment of the small region $600a_1$ in the first row R1 is transferred onto the transfer area $610b_1$, the pattern segment of the small region $600a_2$ in the second row R2 is transferred onto the adjacent transfer area $610b_2$, and the pattern segment of the small region $600a_3$ in the same first row R2 is transferred onto the next transfer area $610b_3$. Similarly, the small regions 600a in the first and second rows R1, R2 are transferred onto the row of transfer areas 610b on the wafer 610 alternately. During the transferring operation, first of all, the small region 600a in the first row R1 is scanned by the electron beam, and then, the small region 600a in the second row R2 is scanned by the electron beam. In this case, in order to transfer the pattern segments on the small regions in the first and second rows R1, R2 onto the transfer areas 610b on the wafer 610 in a line, the electron beams passed through the small regions 600a are appropriately deflected in the x-axis direction.

According to the above-mentioned mask 600, for example, since the small region $600a_1$ in the first row R1 is adjacent to the small region $600a_2$ in the second row R2 regarding the y-axis direction, when the pattern segments on these small regions are transferred onto the transfer areas $610b_1$, $610b_2$, respectively, there is no need to deflect the electron beams in the y-axis direction. Accordingly, even when a large number of small regions 600a are disposed along the y-axis direction, the transferring can be performed with high accuracy. Thus, there is no need for using a deflector having a large dimension in the y-axis direction, thereby making the optical system compact. In the above-mentioned mask 304 of FIG. 14, since the widths (in the y-axis direction) of the bordering regions 304b is small, great heat deformation of the bordering regions 304b may be caused due to the heating of the regions by illumination with the electron beam. However, in the mask 600 according to this embodiment, since the bordering regions 600b each has a greater dimension, the heat can easily dissipate from these regions, thereby suppressing the heat deformation. If the width Ly of the bordering region 600b is greater than the width Wy of the small region 600a, so long as the difference (Ly-Wy) is smaller than the width of the bordering region 304b of FIG. 14, the deflection amount (in the y-axis direction) of the electron beam can be reduced in comparison with the example shown in FIG. 14.

Figure 19:
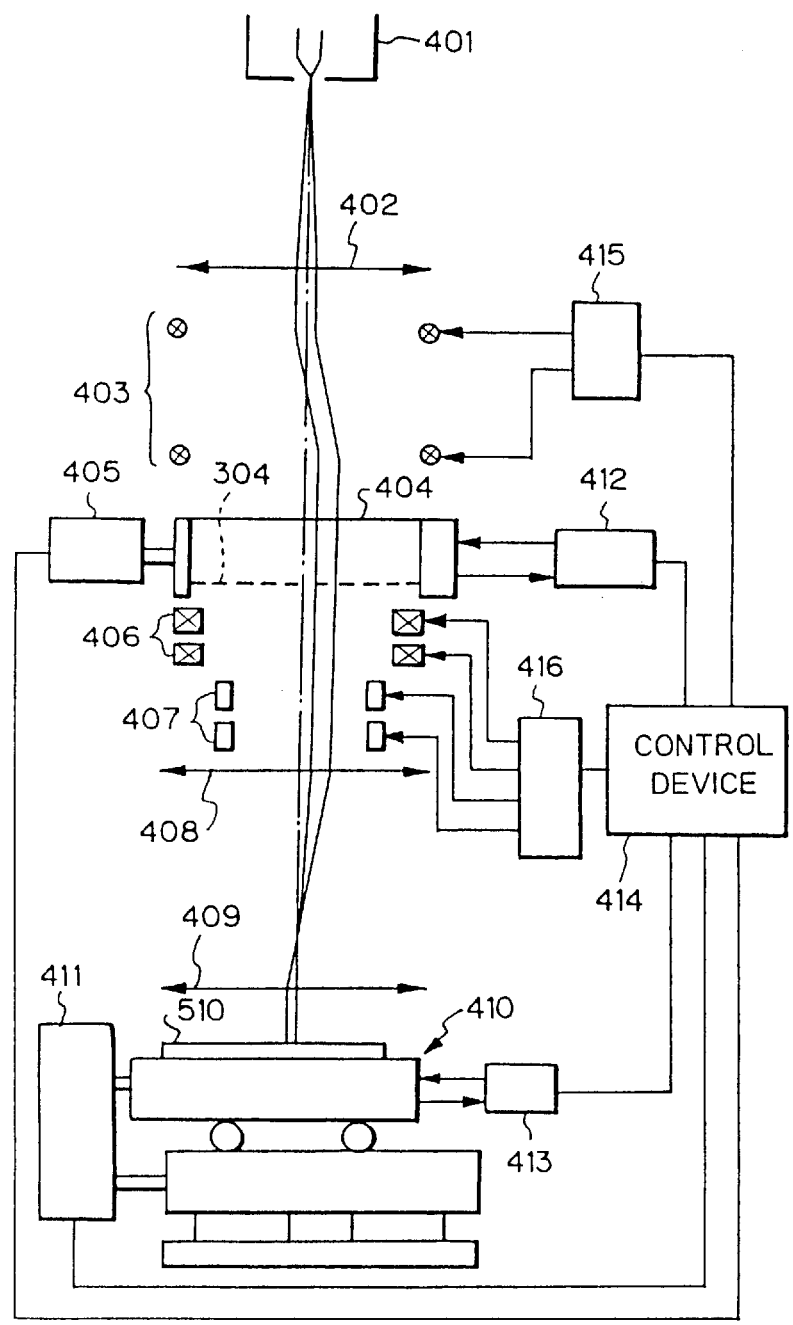
FIG. 19 is a schematic illustration showing an electron beam reduction-transferring apparatus used in a fifth embodiment.

Next, a fifth embodiment of the present invention will be explained with reference to FIGS. 19 to 21. This embodiment utilizes the mask 304 shown in FIG. 14, and, thus, detailed explanation of the mask 304 and the wafer 510 will be omitted. FIG. 19 shows an electron beam reduction-transferring apparatus used in this embodiment, which comprises an electronic gun 401, a condenser lens 402 for collimating an electron beam emitted from the electronic gun 401, a visual field selecting deflector means 403 for directing the electron beam passed through the condenser lens 402 to a predetermined small region 304 on the mask 304, a mask stage 404 for translating the mask 304 in the x-axis and y-axis directions, an actuator 405 for the mask stage 404, a deflector means 406 for deflecting the electron beam passed through the mask 304 in the y-axis direction, a deflector means 407 for deflecting the electron beam in the x-axis direction, a first projection lens 408, a second projection lens 409, a wafer stage 410 for translating the wafer 510 in the x-axis and y-axis directions, and an actuator 411 for the wafer stage 410.

The positions of the mask stage 404 and the wafer stage 410 in the x-axis and y-axis directions are detected by position detectors 412, 413 such as laser interferometers, and the detected results are sent to a control device 414. The control device 414 controls the deflector means 403, 406, 407 via interfaces 415, 416 so that the pattern segments on the mask 340 are transferred onto the wafer 510 in the same manner as described in connection with FIG. 14 and also controls the operations of the actuators 405, 411. Regarding the mask of FIG. 14, although the mask 304 and the wafer 310 are shifted at the constant speed in the x-axis direction, in the fifth embodiment, the shifting movements of the mask 304 and the wafer 510 are controlled in accordance with the sequence shown in FIG. 20.

After the positioning of the mask 304 and the after 510 and the preparation required for effecting the transferring have been finished, when the transferring tart command is inputted, first of all, in a step S11, the control device 414 starts to shift the mask stage 44 and the wafer stage 410 in the x-axis direction. The ratio between the shifting speed of the mask stage 404 and the shifting speed of the wafer stage 410 is equal to the reduction ratio of the pattern. In synchronous with the initiation of the shifting movements of the stages, a row (in the y-axis direction) of small regions 304a on the mask 304 are scanned by the electron beam step by step. In this case, the illuminating position of the electron beam is adjusted by the visual field selecting deflector means 403. After the stages are started to be continuously shifted, the sequence goes to a step S12, where it is judged whether the transferring the row of small regions 304a is finished or not. If affirmative, the sequence goes to a step S13; otherwise, the similar judgement is repeated.

In the step S13, it is judged whether the transferring of all of rows of small regions 304a is finished or not. If not, the sequence goes to a step S14, where the wafer stage 410 is temporarily stopped. In a next step S15, it is judged whether a predetermined waiting time period ti is elapsed by means of a counter (not shown) incorporated in the control device 414. The waiting time period ti is a time period required for shifting the mask 304 by an amount corresponding to the width Lx (in the x-axis direction) of the bordering region 304b. If the waiting time period is not elapsed, the similar judgement is repeated. On the other hand, if the waiting time period is elapsed, the sequence goes to a step S16, where the shifting movement of the wafer stage 410 in the x-axis direction is re-started. In synchronous with the re-start of the shifting movement, a next row of small regions 304a is scanned by the electron beam. In the step S13, if affirmative, the sequence goes to a step S17, where the mask stage 404 and the wafer stage 410 are returned to their initial positions for preparation for next transferring, and then, the sequence is ended. When the pattern of the mask is continuously transferred onto a plurality of chip areas 510*a* on the wafer 510, the above-mentioned sequence is repeated. In the above sequence, the judgements in the steps S12 and S13 can be performed by determining the shifted distances of the mask stage 404 and the wafer stage 410 from the transfer start point (in the x-axis direction) on the basis of the detected results of the position detectors 412, 413. Since the time period required for scanning one row and the time period required for scanning all of the rows can be previously known, the judgements in the steps S12 and S13 may also be performed on the basis of the elapsed time period.

Figure 20:
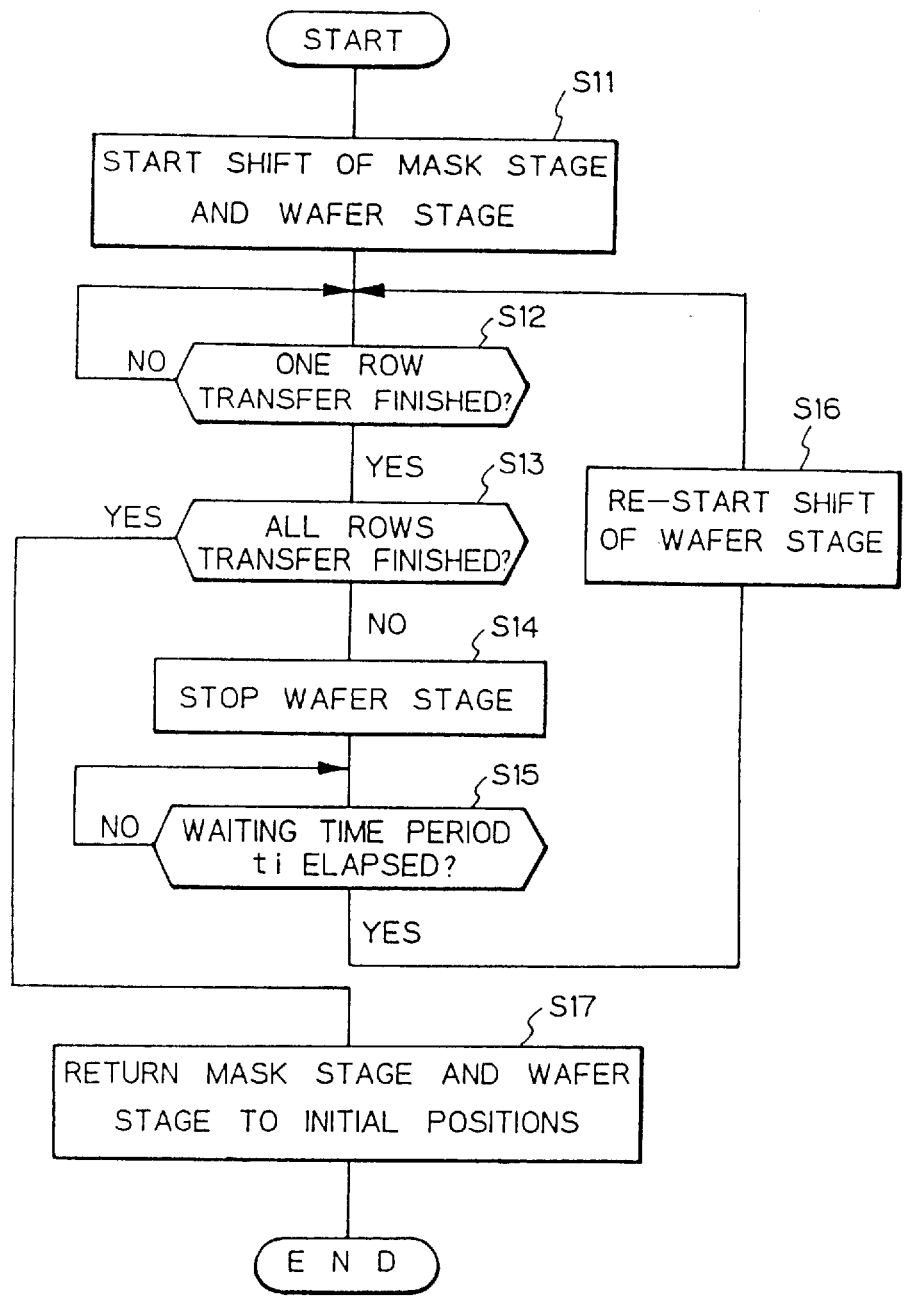
FIG. 20 is a flow chart showing a control sequence for shifting a mask stage and a wafer stage carried out by means of a control device of FIG. 19.
Figure 21:
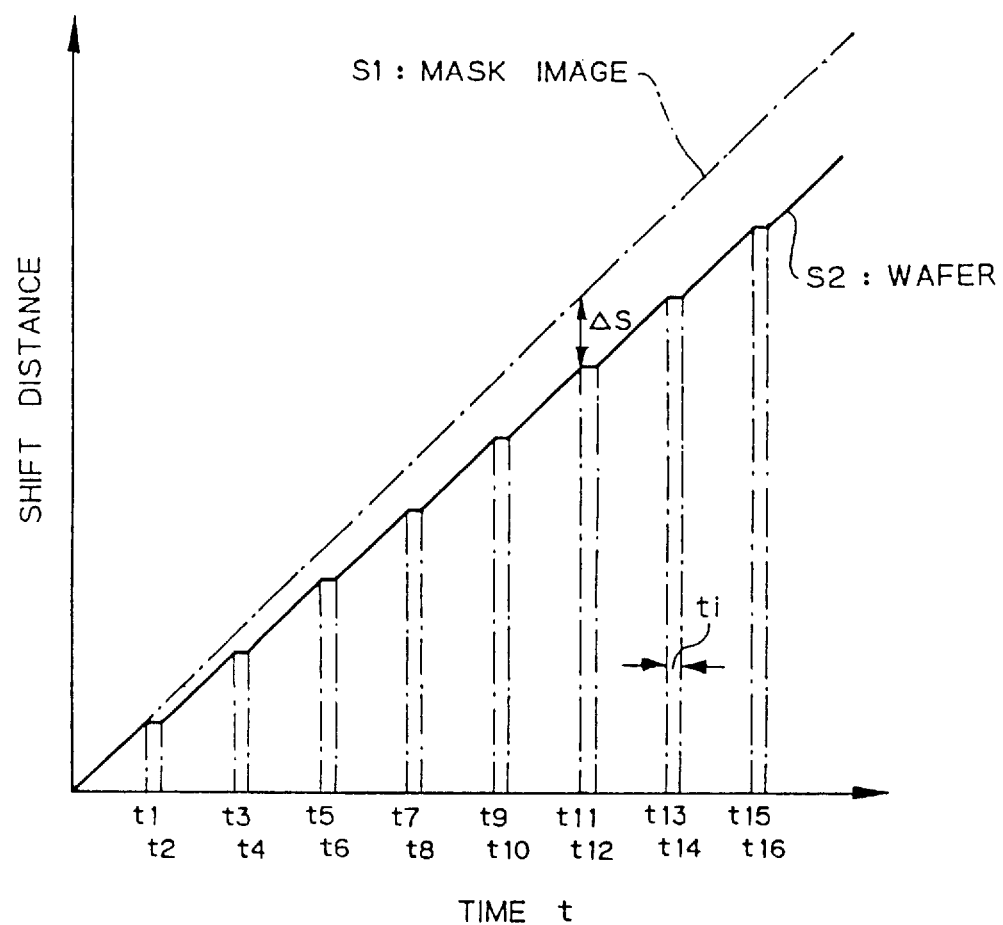
FIG. 21 is a graph showing a relation between a time elapsed after the transferring is started in the sequence of FIG. 20 and a shifting distance of a mask image projected on the wafer and a shifting distance of the wafer.

FIG. 21 is a graph showing a relation between an elapsed time period from the transfer start time and each of a shift distance of an image (mask image) obtained by projecting the mask 304 onto the wafer 510 and a shift distance of the wafer itself, when the sequence of FIG. 20 is carried out. The dot and chain line S1 represents the shift distance of the mask image and the solid line S2 represents the shift distance of the wafer 510. A difference ΔS between the shift distance of the mask image and the shift distance of the wafer indicates the deviation of the relative position between the mask 304 and the wafer 510. In the above sequence, since the mask stage 404 is shifted at the constant speed in the x-axis direction, the shift distance of the mask image is continuously increased from the transfer start point at given inclination or gradient. Although the wafer 510 is shifted in completely synchronous relationship with the mask image till a time t1 when the transferring of the row of small regions 304*a* on the mask 304 is finished after the transferring is started, the wafer is stopped from the time t1 (when one row transfer is finished) to a time t2 when the transferring of the next row is started; meanwhile, the waiting time period ti is elapsed. Due to this stoppage, there arises the deviation in the relative position between the mask 304 and the wafer 510. However, since the mask 304 is shifted by the amount corresponding to the width Lx of the bordering region 304*b* within the waiting time period ti, at the time t2, a row of small regions 304*a* on the mask 304 to be newly transferred is aligned with a row of transfer areas 510*b* on the wafer 510 in the x-axis direction, with the result that there is no need to deflect the electron beam passed through the mask 304 in the x-axis direction.

Similarly, since the wafer 510 is temporarily stopped at times t3, t5, t7, . . . tm (m is odd) when the transferring of each row of the small regions 304*a* on the mask 304 is finished and the shifting movement of the wafer 510 is restarted at times t4, t6, t8, . . . tn (n is even) after the mask 304 is shifted by the amount corresponding to the width Lx of the bordering region 304*b*, there is no need to deflect the electron beam passed through the mask 304 in the x-axis direction by an amount corresponding to the width Lx of the bordering region 304*b*. Accordingly, regarding the deflector means 407 (FIG. 19), if the error in positions (in the x-axis direction) of the mask 304 and the wafer 510 is caused due to the error of shifting movements of the mask 304 and the wafer 510, the electron beam may be deflected merely to correct such error, with the result that the deflection amount of the electron beam is very small. The deflection amount actually supposed is in the order of ±1 $\mu$m.

In the above-mentioned embodiments, the x-axis direction corresponds to the first direction and the y-axis direction corresponds to the second direction. In the illustrated embodiment, while an example that the relative position between the mask 304 and the wafer 510 is changed in a condition that the wafer stage 410 is stopped is explained, between the time t1 and the time t2 in FIG. 21, the wafer stage 410 may be accelerated or the mask stage 404 may be decelerated. In such a case, the deflection amount (in the x-axis direction) of the electron beam can be reduced by an amount corresponding to the increase in the relative shifting movement of the mask 304. This adjustment is not necessarily effected whenever the transferring of each row of small regions is performed, but may be effected, for example, every five rows if a permissible deflection amount in the x-axis direction is greater than the width Lx by five times.

What is claimed is:

1. A reduction-transferring apparatus using a charged particle beam for reduction-transferring a pattern of a mask onto a target by directing a charged particle beam passed through said mask to first and second projection lenses of a charged particle beam optical system having an optical axis, wherein:

when a distance between said mask and said target is L, reduction ratio of pattern from said mask to said target is 1/n, a positive constant number is $\epsilon$ and a point spaced apart from said mask toward said target by an amount of L·n/(n+1) is set as cross-over of said charged particle beam optical system, a central position of said first projection lens along the optical axis is displaced toward said cross-over by an amount of n·$\epsilon$ with respect to the position bisecting the distance between said mask and said cross-over, and a central position of said second projection lens along the optical axis is displaced toward said cross-over by an amount of $\epsilon$ with respect to the position bisecting the distance between said cross-over and said target.

2. A reduction-transferring apparatus according to claim 1, wherein the bore radii of said first and second projection lenses on the side of said cross-over are set to be smaller than ¼ of the bore radii of the projection lenses on the other side.

* * * * *